(12) United States Patent
Kim et al.

(10) Patent No.: US 11,854,864 B2
(45) Date of Patent: Dec. 26, 2023

(54) SEMICONDUCTOR DEVICE INCLUDING TRENCH ISOLATION LAYER AND METHOD OF FORMING THE SAME

(71) Applicant: SAMSUNG ELECTRONICS CO., LTD., Suwon-si (KR)

(72) Inventors: Juyeon Kim, Hwaseong-si (KR); Hanmei Choi, Hwaseong-si (KR); Sukjin Chung, Hwaseong-si (KR); Bongjin Kuh, Hwaseong-si (KR); Changyong Kim, Hwaseong-si (KR); Hakyu Seong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 112 days.

(21) Appl. No.: 17/530,169

(22) Filed: Nov. 18, 2021

(65) Prior Publication Data

US 2022/0084873 A1    Mar. 17, 2022

Related U.S. Application Data

(63) Continuation of application No. 16/780,810, filed on Feb. 3, 2020, now Pat. No. 11,211,284.

(30) Foreign Application Priority Data

May 31, 2019    (KR) .................. 10-2019-0064330

(51) Int. Cl.
*H01L 21/762*    (2006.01)
*H01L 21/02*    (2006.01)

(52) U.S. Cl.
CPC .. *H01L 21/76229* (2013.01); *H01L 21/02126* (2013.01); *H01L 21/02164* (2013.01); *H01L 21/02238* (2013.01); *H01L 21/76237* (2013.01)

(58) Field of Classification Search
CPC ........ H01L 21/76229; H01L 21/76232; H01L 21/76837; H01L 29/4236
See application file for complete search history.

(56) References Cited

U.S. PATENT DOCUMENTS

| | | | |
|---|---|---|---|
| 8,685,832 B2 | 4/2014 | Watanabe | |
| 9,865,496 B2 | 1/2018 | Kim et al. | |
| 2007/0287261 A1 | 12/2007 | Raaijmakers et al. | |
| 2008/0242097 A1 | 10/2008 | Boescke et al. | |
| 2011/0117721 A1* | 5/2011 | Kim ................. | H01L 21/76229 438/428 |
| 2012/0202336 A1* | 8/2012 | Park ................. | H01L 21/76229 257/E21.546 |
| 2013/0052795 A1 | 2/2013 | Watanabe | |
| 2017/0186642 A1 | 6/2017 | Kim et al. | |

FOREIGN PATENT DOCUMENTS

| | | |
|---|---|---|
| KR | 20050002098 A | 1/2005 |
| KR | 20070000062 A | 6/2005 |
| KR | 100564550 B2 | 3/2006 |
| KR | 20090074341 A | 7/2009 |

* cited by examiner

*Primary Examiner* — Julia Slutsker
(74) *Attorney, Agent, or Firm* — Fish & Richardson P.C.

(57) ABSTRACT

A semiconductor device includes a plurality of patterns defined between a plurality of trenches and disposed on a substrate. A leaning control layer is disposed on sidewalls and bottoms of the plurality of trenches. A gap-fill insulating layer is disposed on the leaning control layer. At least one of the plurality of trenches has a different depth from one of the plurality of trenches adjacent thereto.

16 Claims, 17 Drawing Sheets

SEMICONDUCTOR DEVICE INCLUDING TRENCH ISOLATION LAYER AND METHOD OF FORMING THE SAME

CROSS-REFERENCE TO RELATED APPLICATION

This is a Continuation of U.S. application Ser. No. 16/780,810, filed Feb. 3, 2020, now U.S. Pat. No. 11,211,284, issued Dec. 28, 2021, and a claim of priority under 35 U.S.C. § 119 is made to Korean Patent Application No. 10-2019-0064330, filed on May 31, 2019, in the Korean Intellectual Property Office (KIPO), the disclosures of which are incorporated herein by reference in their entireties.

BACKGROUND

1. Field

Devices and methods consistent with example embodiments relate to a semiconductor device including a trench isolation layer and a method of forming the device.

2. Description of Related Art

With an increase in the integration density of semiconductor devices, a technique of using a plurality of patterns having a high aspect ratio has been attempted. The difficulty of a process of filling an insulating layer between the plurality of patterns has gradually increased. For example, defects, such as leaning, may occur during the process of filling the insulating layer between the plurality of patterns.

SUMMARY

The example embodiments of the disclosure are directed to providing a semiconductor device, which is advantageous for a high integration density and has excellent electrical properties, and a method of forming the semiconductor device.

According to example embodiments, there is a semiconductor device including a plurality of patterns defined between a plurality of trenches and disposed on a substrate. A leaning control layer is disposed on sidewalls and bottoms of the plurality of trenches. A gap-fill insulating layer is disposed on the leaning control layer. At least one of the plurality of trenches has a different depth from one of the plurality of trenches adjacent thereto.

According to example embodiments, there is provided a semiconductor device including a pattern defined between a first trench and a second trench and disposed on a substrate. A gap-fill insulating layer is disposed inside the first and second trenches. The first trench has a first depth, and the second trench has a second depth that is smaller than the first depth. When: (1) a lower point, which is adjacent to a bottom of the second trench and disposed at a center of a portion between the first trench and the second trench, is defined in the pattern, (2) a lower straight line, which passes through the lower point and is perpendicular to a lower surface of the substrate, is defined, (3) an upper point, which is disposed in an upper region of the pattern at the center of the portion between the first trench and the second trench, is defined in the pattern, and (4) an upper straight line, which passes through the upper point and is perpendicular to the lower surface of the substrate, is defined, the upper straight line is disposed between the lower straight line and the second trench.

According to example embodiments, there is provided a semiconductor device including a plurality of patterns defined between a plurality of trenches and disposed on a substrate. A leaning control layer is disposed on sidewalls and bottoms of the plurality of trenches. A gap-fill insulating layer is disposed on the leaning control layer. A gate dielectric layer is disposed on the plurality of patterns. A gate electrode is disposed on the gate dielectric layer. The plurality of trenches include a plurality of first trenches having a first depth, a second trench having a second depth that is smaller than the first depth, and a third trench having a third depth that is smaller than the second depth. The plurality of patterns include a first pattern defined between one of the plurality of first trenches adjacent thereto and the second trench and a second pattern defined between one of the plurality of first trenches adjacent thereto and the third trench. The first pattern includes a first active pattern defined in the substrate and at least one second active pattern disposed on the first active pattern. The second pattern includes a third active pattern defined in the substrate and at least one fourth active pattern disposed on the third active pattern. The gate electrode extends between the first active pattern and the at least one second active pattern and between the third active pattern and the at least one fourth active pattern. When: (1) a first lower point, which is adjacent to a bottom of the second trench and disposed at a center of a portion between one of the plurality of first trenches adjacent thereto and the second trench, is defined in the first pattern, (2) a first lower straight line, which passes through the first lower point and is perpendicular to the lower surface of the substrate, is defined, (3) a first upper point is defined at a center of the at least one second active pattern, and (4) a first upper straight line, which passes through the first upper point and is perpendicular to the lower surface of the substrate, is defined, the first upper straight line is disposed between the one of the plurality of first trenches adjacent thereto and the first lower straight line. When: (1) a second lower point, which is adjacent to a bottom of the third trench and disposed at a center of a portion between one of the plurality of first trenches adjacent thereto and the third trench, is defined in the second pattern, (2) a second lower straight line, which passes through the second lower point and is perpendicular to the lower surface of the substrate, is defined, (3) a second upper point is defined at a center of the at least one fourth active pattern, and (4) a second upper straight line, which passes through the second upper point and is perpendicular to the lower surface of the substrate, is defined, the second upper straight line is arranged to be substantially collinear with the second lower straight line.

DETAILED DESCRIPTION OF EXEMPLARY EMBODIMENTS

FIGS. 1 to 8 are cross-sectional views illustrating a semiconductor device according to embodiments of the disclosure.

Figure 1:
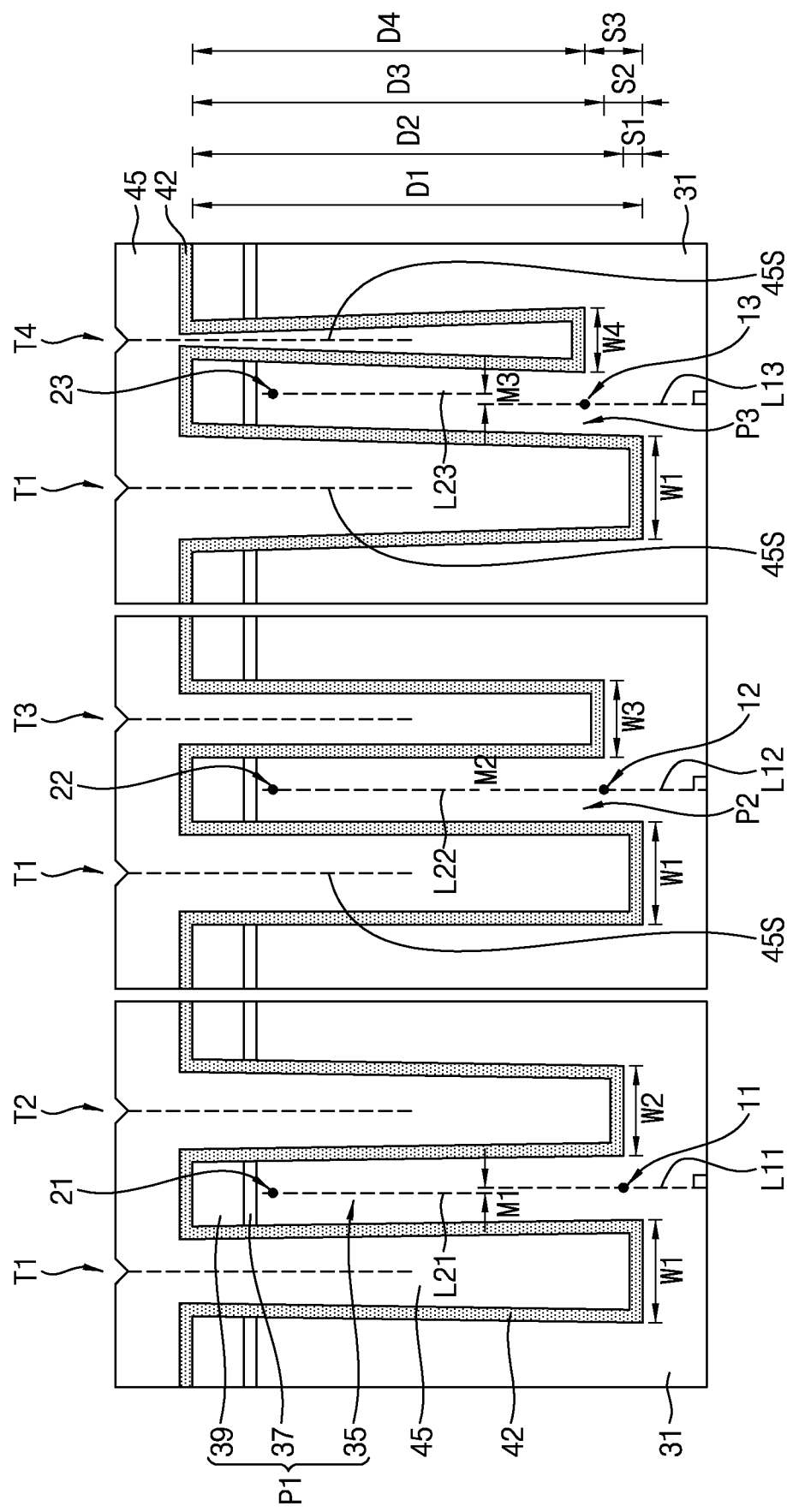
FIGS. 1 to 8 are cross-sectional views illustrating a semiconductor device according to embodiments of the disclosure.

Referring to FIG. 1, a semiconductor device according to an embodiment of the disclosure may include a substrate 31, a plurality of trenches T1, T2, T3, and T4, a plurality of patterns P1, P2, and P3, a leaning control layer 42, and a gap-fill insulating layer 45. In an embodiment, each of the plurality of patterns P1, P2, and P3 may include an active pattern 35, a buffer layer 37 on the active pattern 35, and a mask layer 39 on the buffer layer 37. The gap-fill insulating layer 45 may include a seam 45S adjacent to a center of each of the plurality of trenches T1, T2, T3, and T4. The leaning control layer 42 and the gap-fill insulating layer 45 may be interpreted as a trench isolation layer.

A height of each of the plurality of patterns P1, P2, and P3 may be greater than a lateral width thereof. A height of each of the plurality of trenches T1, T2, T3, and T4 may be greater than a lateral width thereof. The plurality of trenches T1, T2, T3, and T4 may include a plurality of first trenches T1, a second trench T2 having a smaller depth than the plurality of first trenches T1, a third trench T3 having a smaller depth than the second trench T2, and a fourth trench T4 having a smaller depth than the third trench T3. The plurality of patterns P1, P2, and P3 may include a first pattern P1, a second pattern P2, and a third pattern P3. The first pattern P1 may be defined between one of the plurality of first trenches T1 adjacent thereto and the second trench T2. The second pattern P2 may be defined between one of the plurality of first trenches T1 adjacent thereto and the third trench T3. The third pattern P3 may be defined between one of the plurality of first trenches T1 adjacent thereto and the fourth trench T4.

Each of the plurality of first trenches T1 may have substantially the same lateral width. Each of the plurality of first trenches T1 may exhibit a first lateral width W1. The second trench T2 may exhibit a second lateral width W2 that is smaller than the first lateral width W1. The third trench T3 may exhibit a third lateral width W3 that is smaller than the second lateral width W2. The fourth trench T4 may exhibit a fourth lateral width W4 that is smaller than the third lateral width W3.

In an embodiment, each of the plurality of first trenches T1 may exhibit a first depth D1. Each of the plurality of first trenches T1 may have substantially the same depth. The second trench T2 may exhibit a second depth D2 that is smaller than the first depth D1. The third trench T3 may exhibit a third depth D3 that is smaller than the second depth D2. The fourth trench T4 may exhibit a fourth depth D4 that is smaller than the third depth D3. A distance between a bottom of the second trench T2 and a lower surface of the substrate 31 may be greater than a distance between a bottom of one of the plurality of first trenches T1 adjacent thereto and the lower surface of the substrate 31. A first step difference S1 may be formed between the second trench T2 and one of the plurality of first trenches T1 adjacent thereto.

A distance between a bottom of the third trench T3 and the lower surface of the substrate 31 may be greater than a distance between a bottom of one of the plurality of first trenches T1 adjacent thereto and the lower surface of the substrate 31. A second step difference S2 may be formed between the third trench T3 and one of the plurality of first trenches T1 adjacent thereto. The second step difference S2 may be greater than the first step difference S1. A distance between a bottom of the fourth trench T4 and the lower surface of the substrate 31 may be greater than a distance between a bottom of one of the plurality of first trenches T1 adjacent thereto and the lower surface of the substrate 31. A third distance S3 may be formed between the fourth trench T4 and one of the plurality of first trenches T1 adjacent thereto. The third step difference S3 may be greater than the second step difference S2.

In an embodiment, a pitch of the plurality of patterns P1, P2, and P3 may be substantially equal to a pitch of the plurality of trenches T1, T2, T3, and T4. In an embodiment, the leaning control layer 42 may conformally cover sidewalls and bottoms of the plurality of trenches T1, T2, T3, and T4. The leaning control layer 42 may be formed on side surfaces and upper surfaces of the plurality of patterns P1, P2, and P3. The leaning control layer 42 may include a material layer exhibiting compressive stress. The leaning control layer 42 may include silicon oxide, silicon nitride, silicon oxynitride, or a combination thereof. The leaning control layer 42 may serve to apply compressive stress to the plurality of patterns P1, P2, and P3. Each of the plurality of patterns P1, P2, and P3 may be deformed due to the leaning control layer 42. The leaning control layer 42 may be referred to as a compressive stress liner.

In an embodiment, the gap-fill insulating layer 45 may be disposed on the leaning control layer 42 to fill the plurality of trenches T1, T2, T3, and T4. During the formation of the gap-fill insulating layer 45, each of the plurality of patterns P1, P2, and P3 may be deformed due to a zip-up phenomenon, that is, a phenomenon where an attractive force acts between adjacent layers to bond the adjacent layers to each other. Shapes of the plurality of patterns P1, P2, and P3 may be controlled using the leaning control layer 42 and the gap-fill insulating layer 45. Each of the plurality of patterns P1, P2, and P3 may be deformed depending on the first to fourth depths D1, D2, D3, and D4 of the plurality of trenches T1, T2, T3, and T4.

For example, a first lower point 11, which is adjacent to a bottom of the second trench T2 and disposed at a center of a portion between the second trench T2 and one of the plurality of first trenches T1 adjacent thereto, may be defined in the first pattern P1. A first lower straight line L11, which passes through the first lower point 11 and is perpendicular to the lower surface of the substrate 31, may be defined. A first upper point 21, which is disposed in an upper region of the first pattern P1 at the center of the portion between the second trench T2 and the one of the plurality of first trenches T1 adjacent thereto, may be defined in the first pattern P1. A first upper straight line L21, which passes through the first upper point 21 and is perpendicular to the lower surface of the substrate 31, may be defined. A deformation force applied by the leaning control layer 42 to the first pattern P1 may be greater than an attractive force applied by the gap-fill insulating layer 45 to the first pattern P1. The first pattern P1 may lean toward a center of one of the plurality of first trenches T1 adjacent thereto. The first upper straight line L21 may be formed relatively closer to a center of one of the plurality of first trenches T1 adjacent thereto than the first lower straight line L11. The first upper straight line L21 may be disposed between the first lower straight line L11 and the one of the plurality of first trenches T1 adjacent thereto. A first length M1 may be formed between the first lower straight line L11 and the first upper straight line L21. A second lower point 12, which is adjacent to a bottom of the third trench T3 and disposed at a center of a portion between the third trench T3 and one of the plurality of first trenches T1 adjacent thereto, may be defined in the second pattern P2. A second lower straight line L12, which passes through the second lower point 12 and is perpendicular to the lower surface of the substrate 31, may be defined. A second upper point 22, which is disposed in an upper region of the second pattern P2 at the center of the portion between the third trench T3 and the one of the plurality of first trenches T1 adjacent thereto, may be defined in the second pattern P2. A second upper straight line L22, which passes through the second upper point 22 and is perpendicular to the lower surface of the substrate 31, may be defined. A deformation force applied by the leaning control layer 42 to the second pattern P2 may be substantially equal to an attractive force applied by the gap-fill insulating layer 45 to the second pattern P2. The second pattern P2 may be formed to be perpendicular onto the substrate 31. The second upper straight line L22 may be arranged to be substantially collinear with the second lower straight line L12. A second length M2 between the second lower straight line L12 and the second upper straight line L22 may be substantially zero.

A third lower point 13, which is adjacent to a bottom of the fourth trench T4 and disposed at a center of a portion between the fourth trench T4 and one of the plurality of first trenches T1 adjacent thereto, may be defined in the third pattern P3. A third straight line L13, which passes through the third lower point 13 and is perpendicular to the lower surface of the substrate 31, may be defined. A third upper point 23, which is disposed in an upper region of the third pattern P3 at the center of the portion between the fourth trench T4 and the one of the plurality of first trenches T1 adjacent thereto, may be defined in the third pattern P3. A third upper straight line L23, which passes through the third upper point 23 and is perpendicular to the lower surface of the substrate 31, may be defined. A deformation force applied by the leaning control layer 42 to the third pattern P3 may be smaller than an attractive force applied by the gap-fill insulating layer 45 to the third pattern P3. The third pattern P3 may lean toward a center of the fourth trench T4. The third upper straight line L23 may be formed relatively closer to the center of the fourth trench T4 than the third lower straight line L13. The third upper straight line L23 may be disposed between the third lower straight line L13 and the fourth trench T4. A third length M3 may be formed between the third lower straight line L13 and the third upper straight line L23.

In an embodiment, each of the first upper point 21, the second upper point 22, and the third upper point 23 may be defined in an upper region of the active pattern 35.

Figure 2:
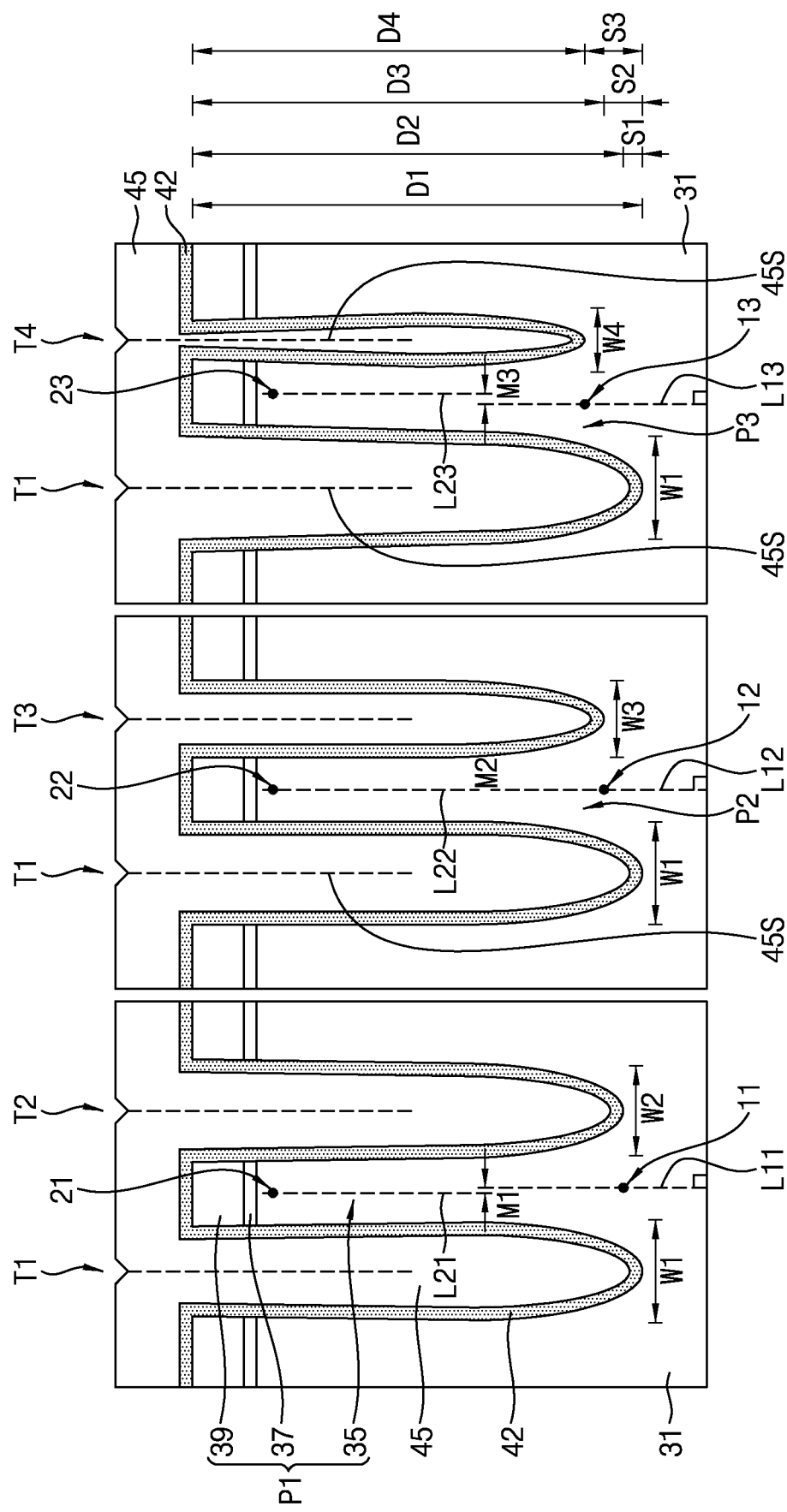

Referring to FIG. 2, bottoms of a plurality of trenches T1, T2, T3, and T4 may be rounded.

Figure 3:
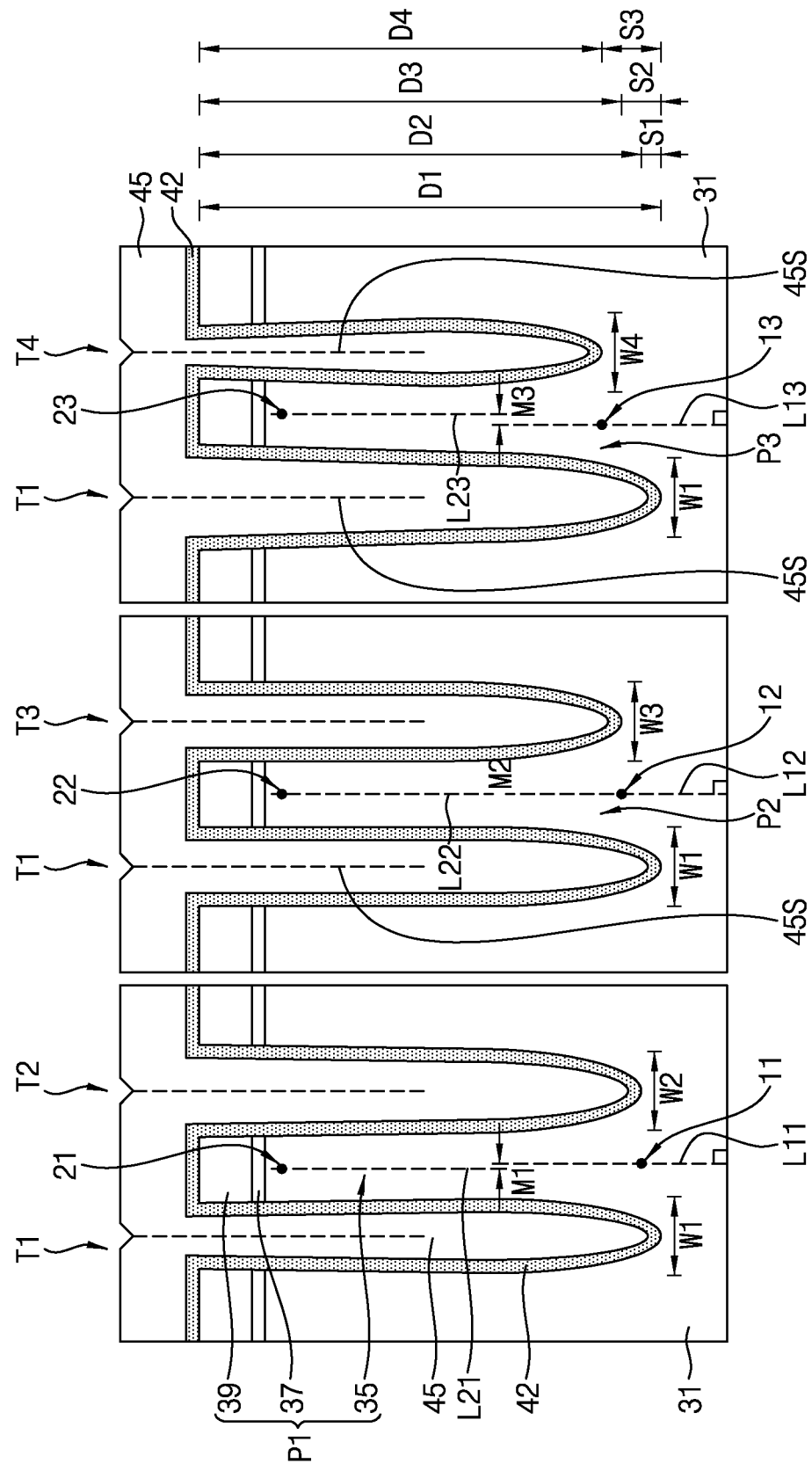

Referring to FIG. 3, a pitch of a plurality of patterns P1, P2, and P3 may be substantially equal to a pitch of a plurality of trenches T1, T2, T3, and T4. In an embodiment, first to fourth lateral widths W1 to W4 may be substantially the same.

Figure 4:
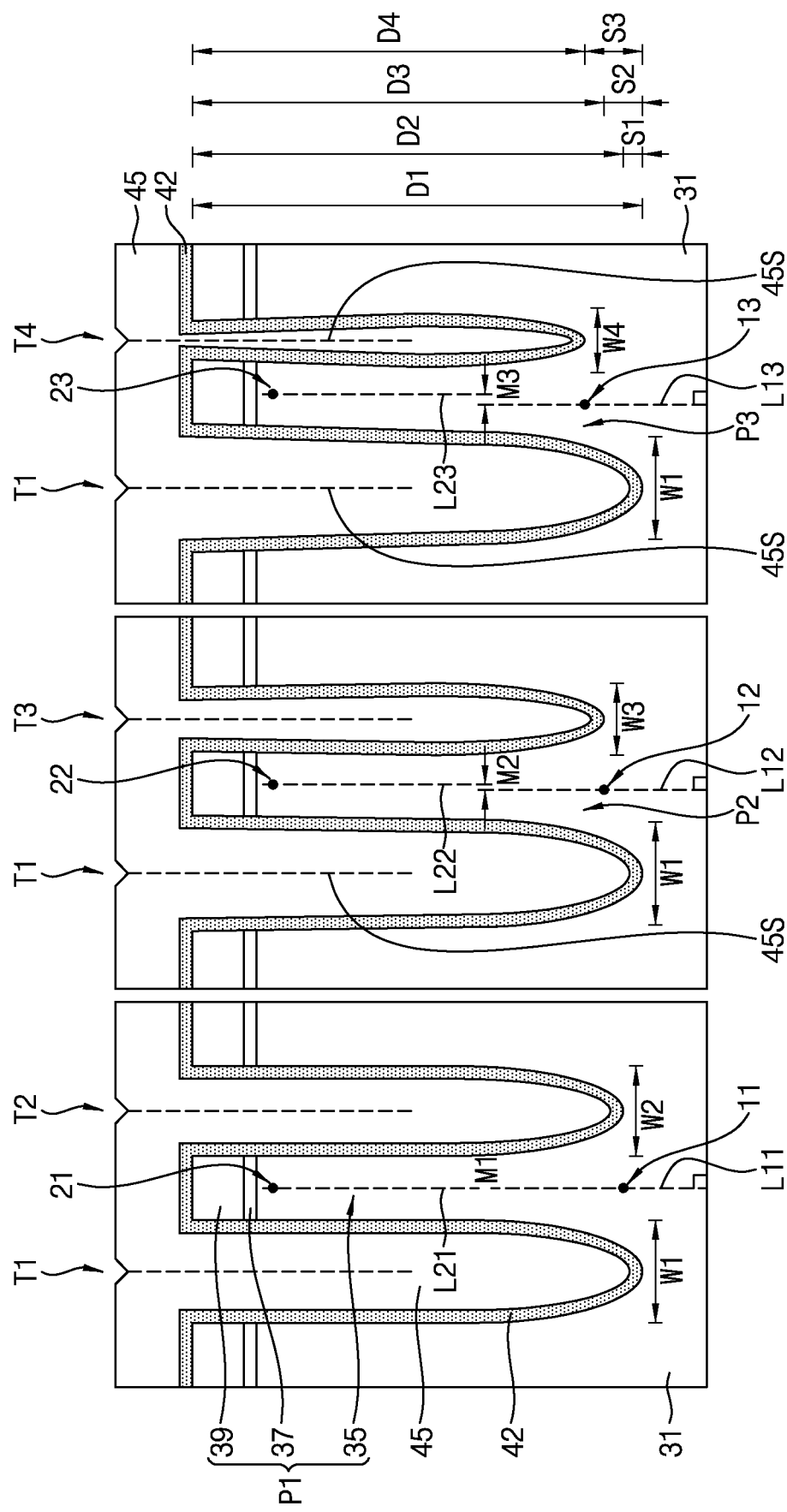

Referring to FIG. 4, a first pattern P1 may be formed to be perpendicular onto the substrate 31. A first upper straight line L21 may be arranged to be substantially collinear with a first lower straight line L11. A first length M1 substantially equal to zero may be formed between the first lower straight line L11 and the first upper straight line L21. A second pattern P2 may lean toward a center of a third trench T3. A second upper straight line L22 may be formed relatively closer to the center of the third trench T3 than a second lower straight line L12. The second upper straight line L22 may be disposed between the second lower straight line L12 and the third trench T3. A second length M2 may be formed between the second lower straight line L12 and the second upper straight line L22. A third pattern P3 may lean toward a center of a fourth trench T4. A third upper straight line L23 may be formed relatively closer to the center of the fourth trench T4 than a third lower straight line L13. The third upper straight line L23 may be disposed between the third lower straight line L13 and the fourth trench T4. A third length M3 may be formed between the third lower straight line L13 and the third upper straight line L23. The third length M3 may be greater than the second length M2.

Figure 5:
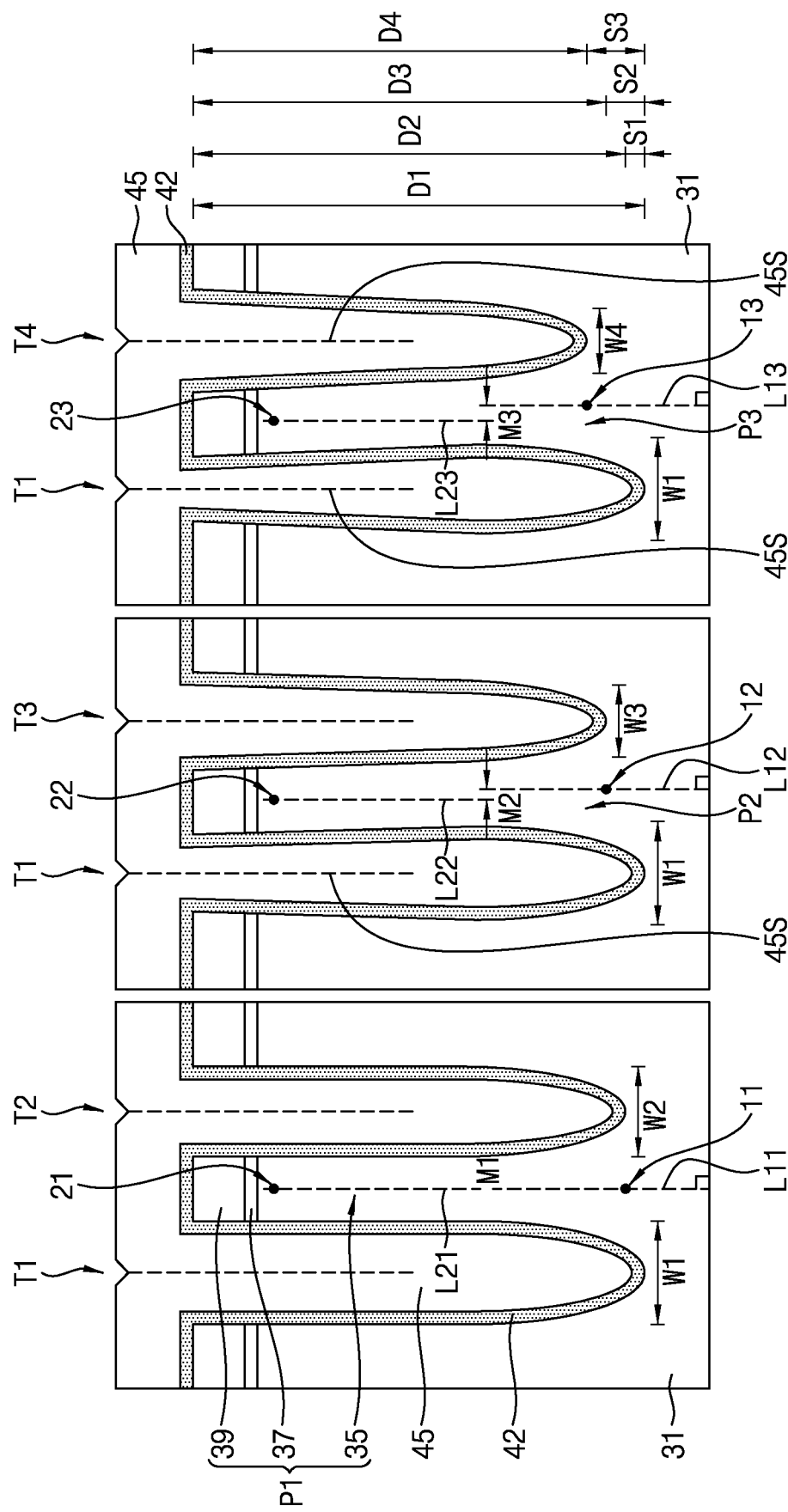

Referring to FIG. 5, a first pattern P1 may be formed to be perpendicular onto the substrate 31. A first upper straight line L21 may be arranged to be substantially collinear with a first lower straight line L11. A first length M1 substantially equal to zero may be formed between the first lower straight line L11 and the first upper straight line L21. A second pattern P2 may lean toward a center of one of a plurality of first trenches T1 adjacent thereto. A second upper straight line L22 may be formed relatively closer to the center of the one of the plurality of first trenches T1 adjacent thereto than a second lower straight line L12. The second upper straight line L22 may be disposed between the second lower straight line L12 and the one of the plurality of first trenches T1 adjacent thereto. A second length M2 may be formed between the second lower straight line L12 and the second upper straight line L22. A third pattern P3 may lean toward a center of one of the plurality of first trenches T1 adjacent thereto. A third upper straight line L23 may be formed relatively closer to the center of the one of the plurality of first trenches T1 adjacent thereto than a third lower straight line L13. The third upper straight line L23 may be disposed between the third lower straight line L13 and the one of the plurality of first trenches T1 adjacent thereto. A third length M3 may be formed between the third lower straight line L13 and the third upper straight line L23. The third length M3 may be greater than the second length M2.

Figure 6:
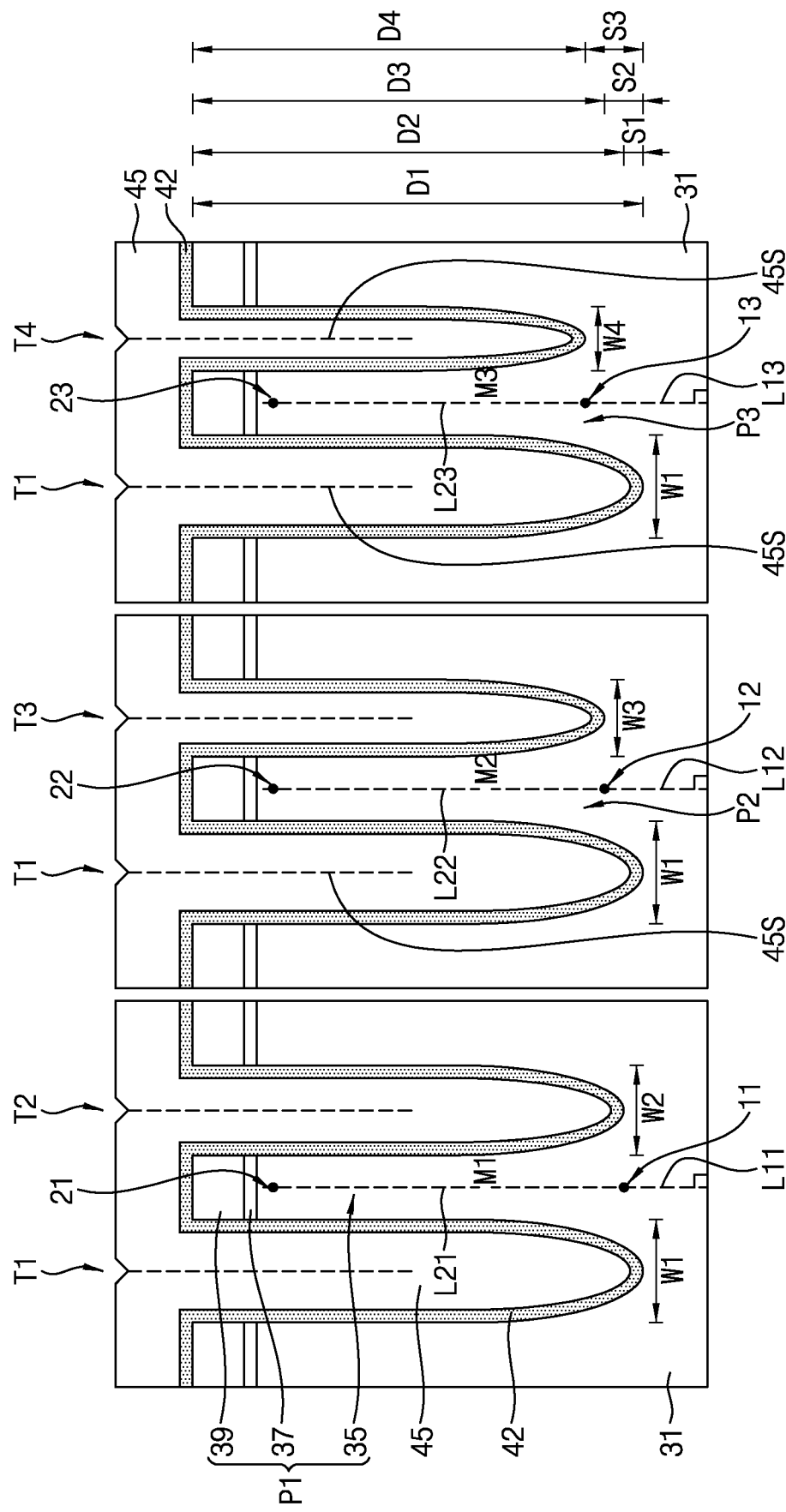

Referring to FIG. 6, each of a first pattern P1, a second pattern P2, and a third pattern P3 may be formed to be perpendicular onto the substrate 31.

Figure 7:
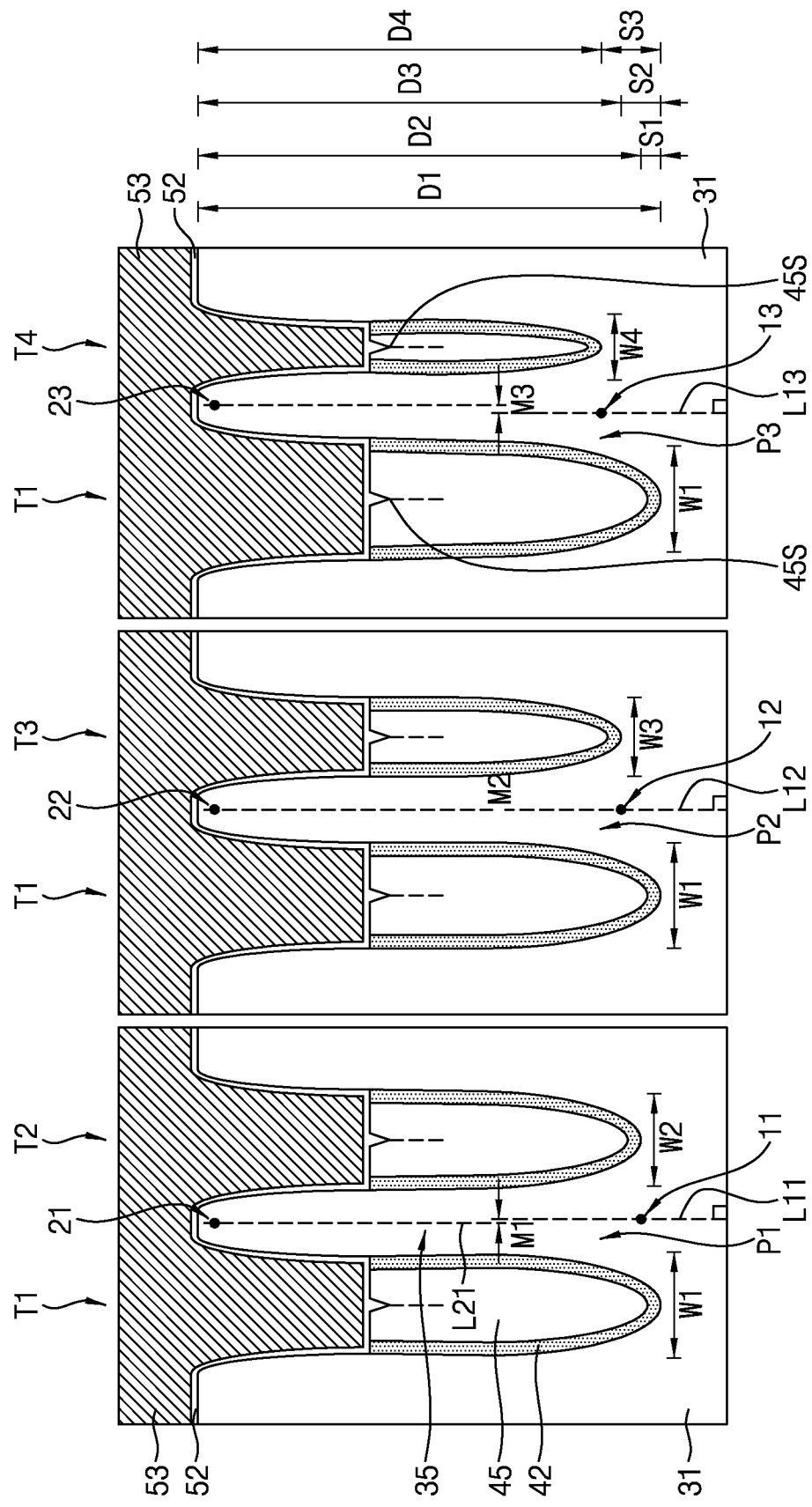

Referring to FIG. 7, a gate electrode 53 may be disposed on a plurality of patterns P1, P2, and P3. A gate dielectric layer 52 may be disposed between the gate electrode 53 and the plurality of patterns P1, P2, and P3. Each of the plurality of patterns P1, P2, and P3 may have a configuration similar to that described with reference to FIGS. 1 to 6.

In an embodiment, upper surfaces of a gap-fill insulating layer 45 and a leaning control layer 42 may be disposed at a level lower than an upper end of an active pattern 35. The gap-fill insulating layer 45 may include a seam 45S adjacent to a center of each of a plurality of trenches T1, T2, T3, and T4. The gate dielectric layer 52 may be in contact with an upper surface and side surfaces of the active pattern 35. The gate electrode 53 may be disposed on the gate dielectric layer 52. The gate dielectric layer 52 may extend between the gate electrode 53 and the gap-fill insulating layer 45 and between the gate electrode 53 and the leaning control layer 42. The gate dielectric layer 52 may extend into the seam 45S.

Figure 8:
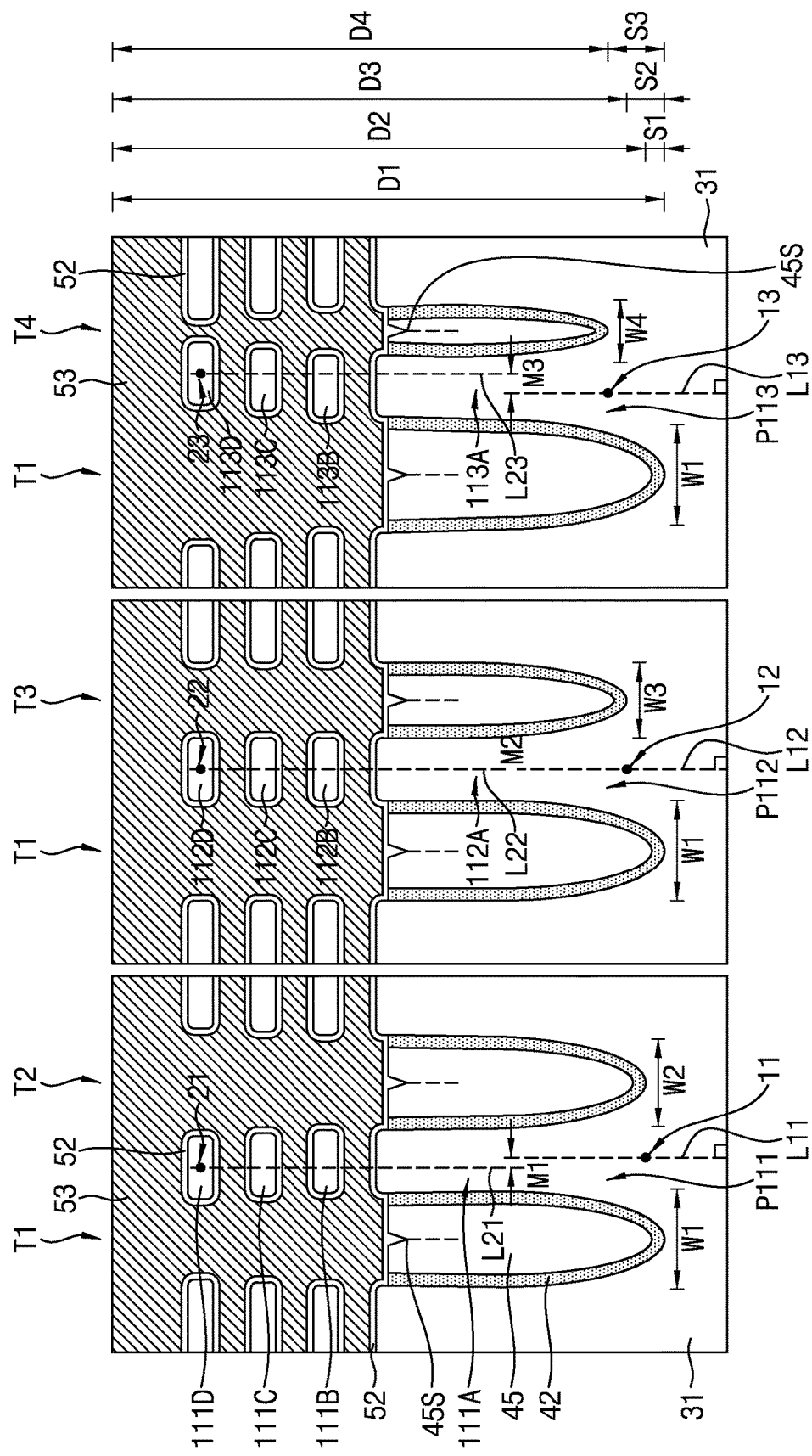

Referring to FIG. 8, a semiconductor device according to an embodiment of the disclosure may include a substrate 31, a plurality of trenches T1, T2, T3, and T4, a plurality of patterns P111, P112, and P113, a leaning control layer 42, a gap-fill insulating layer 45, a gate dielectric layer 52, and a gate electrode 53. The gap-fill insulating layer 45 may include a seam 45S adjacent to a center of each of the plurality of trenches T1, T2, T3, and T4.

In an embodiment, the plurality of patterns P111, P112, and P113 may include a first pattern P111, a second pattern P112, and a third pattern P113. The first pattern P111 may include first to fourth active patterns 111A, 111B, 111C, and 111D. The second pattern P112 may include fifth to eighth active patterns 112A, 112B, 112C, and 112D. The third pattern P113 may include ninth to twelfth active patterns 113A, 113B, 113C, and 113D. Each of the first active pattern 111A, the fifth active pattern 112A, and the ninth active pattern 113A may be defined in the substrate 31 by the plurality of trenches T1, T2, T3, and T4. The second to fourth active patterns 111B, 111C, and 111D may be sequentially disposed on the first active pattern 111A. The sixth to eighth active patterns 112B, 112C, and 112D may be sequentially disposed on the fifth active pattern 112A. The tenth to twelfth active patterns 113B, 113C, and 113D may be sequentially disposed on the ninth active pattern 113A.

Upper surfaces of the gap-fill insulating layer 45 and the leaning control layer 42 may be disposed at a level lower than upper ends of the first active pattern 111A, the fifth active pattern 112A, and the ninth active pattern 113A.

The gate electrode 53 may surround upper surfaces, side surfaces, and lower surfaces of the second to fourth active patterns 111B, 111C, 111D, the sixth to eighth active patterns 112B, 112C, and 112D, and the tenth to twelfth active patterns 113B, 113C, and 113D. The gate electrode 53 may be disposed between the first active pattern 111A and the second active pattern 111B, between the fifth active pattern 112A and the sixth active pattern 112B, and between the ninth active pattern 113A and the tenth active pattern 113B. The gate electrode 53 may extend on a side surface of the first active pattern 111A, a side surface of the fifth active pattern 112A, and a side surface of the ninth active pattern 113A. The gate dielectric layer 52 may be disposed between the gate electrode 53 and the first to twelfth active patterns 111A to 113D. The gate dielectric layer 52 may extend between the gate electrode 53 and the gap-fill insulating layer 45. The gate dielectric layer 52 may extend into the seam 45S.

In an embodiment, the fourth active pattern 111D may be interpreted as a second active pattern, the fifth active pattern 112A may be interpreted as a third active pattern, the eighth active pattern 112D may be interpreted as a fourth active pattern, the ninth active pattern 113A may be interpreted as a fifth active pattern, and the twelfth active pattern 113D may be interpreted as a sixth active pattern.

In an embodiment, a first lower point 11 may be defined in the first pattern P111. A first lower straight line L11, which passes through the first lower point 11 and is perpendicular to a lower surface of the substrate 31, may be defined. A first upper point 21 may be defined at a center of the fourth active pattern 111D. A first upper straight line L21, which passes through the first upper point 21 and is perpendicular to the lower surface of the substrate 31, may be defined. The first upper straight line L21 may be formed relatively closer to a center of one of the plurality of first trenches T1 adjacent thereto than the first lower straight line L11. The first upper straight line L21 may be disposed between the first lower straight line L11 and the one of the plurality of first trenches T1 adjacent thereto.

A second lower point 12 may be defined in the second pattern P112. A second lower straight line L12, which passes through the second lower point 12 and is perpendicular to the lower surface of the substrate 31, may be defined. A second upper point 22 may be defined at a center of the eighth active pattern 112D. A second upper straight line L22, which passes through the second upper point 22 and is perpendicular to the lower surface of the substrate 31, may be defined. The second pattern P112 may be arranged to be perpendicular onto the substrate 31. The second upper straight line L22 may be arranged to be substantially collinear with the second lower straight line L12. A second length M2 substantially equal to zero may be formed between the second lower straight line L12 and the second upper straight line L22.

A third lower point 13 may be defined in the third pattern P113. A third lower straight line L13, which passes through the third lower point 13 and is perpendicular to the lower surface of the substrate 31, may be defined. A third upper point 23 may be defined at a center of the twelfth active pattern 113D. A third upper straight line L23, which passes through the third upper point 23 and is perpendicular to the lower surface of the substrate 31, may be defined. The third pattern P113 may lean toward a center of the fourth trench T4. The third upper straight line L23 may be formed relatively closer to the center of the fourth trench T4 than the third lower straight line L13. The third upper straight line L23 may be disposed between the third lower straight line L13 and the fourth trench T4. A third length M3 may be formed between the third lower straight line L13 and the third upper straight line L23. The third length M3 may be greater than the first length M1.

Figure 9:
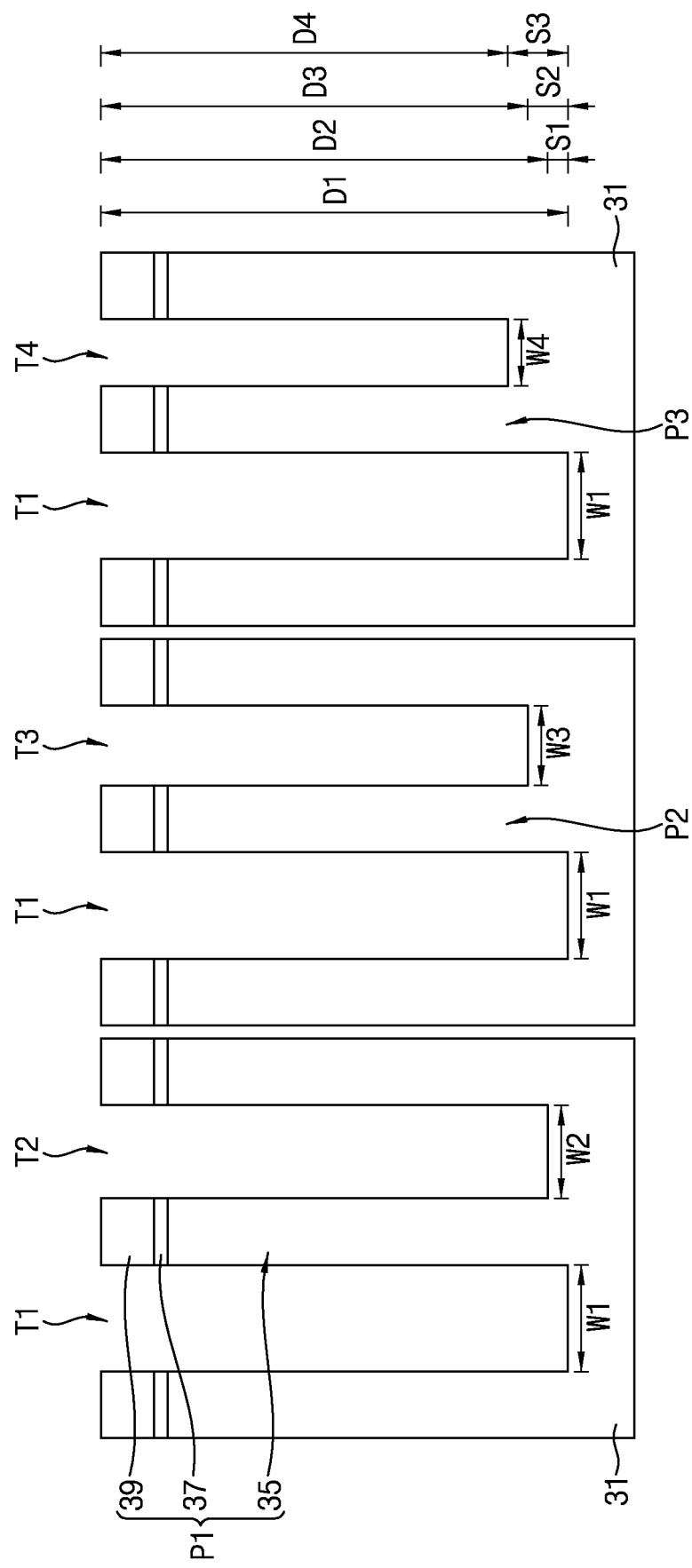
FIGS. 9 to 18 are cross-sectional views illustrating methods of forming semiconductor devices according to embodiments of the disclosure.
Figure 10:
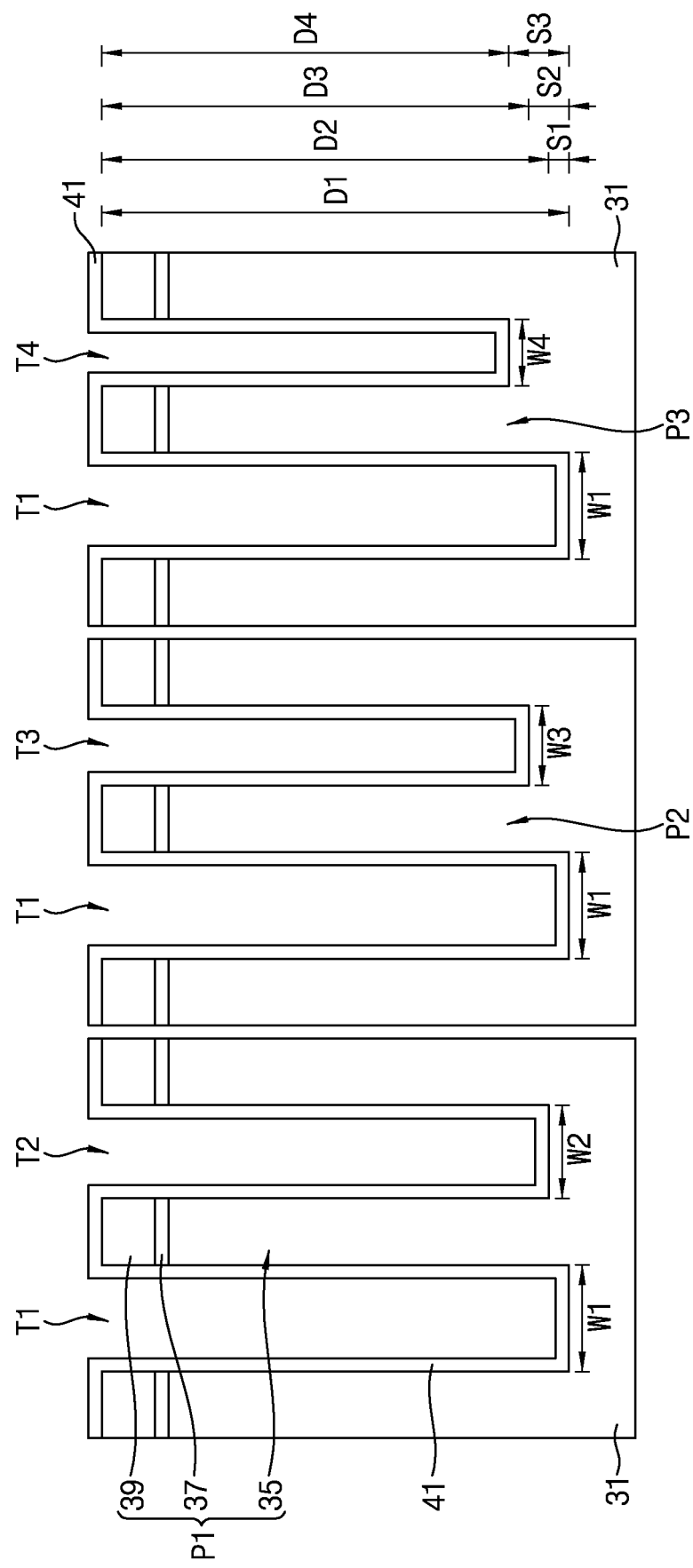
Figure 11:
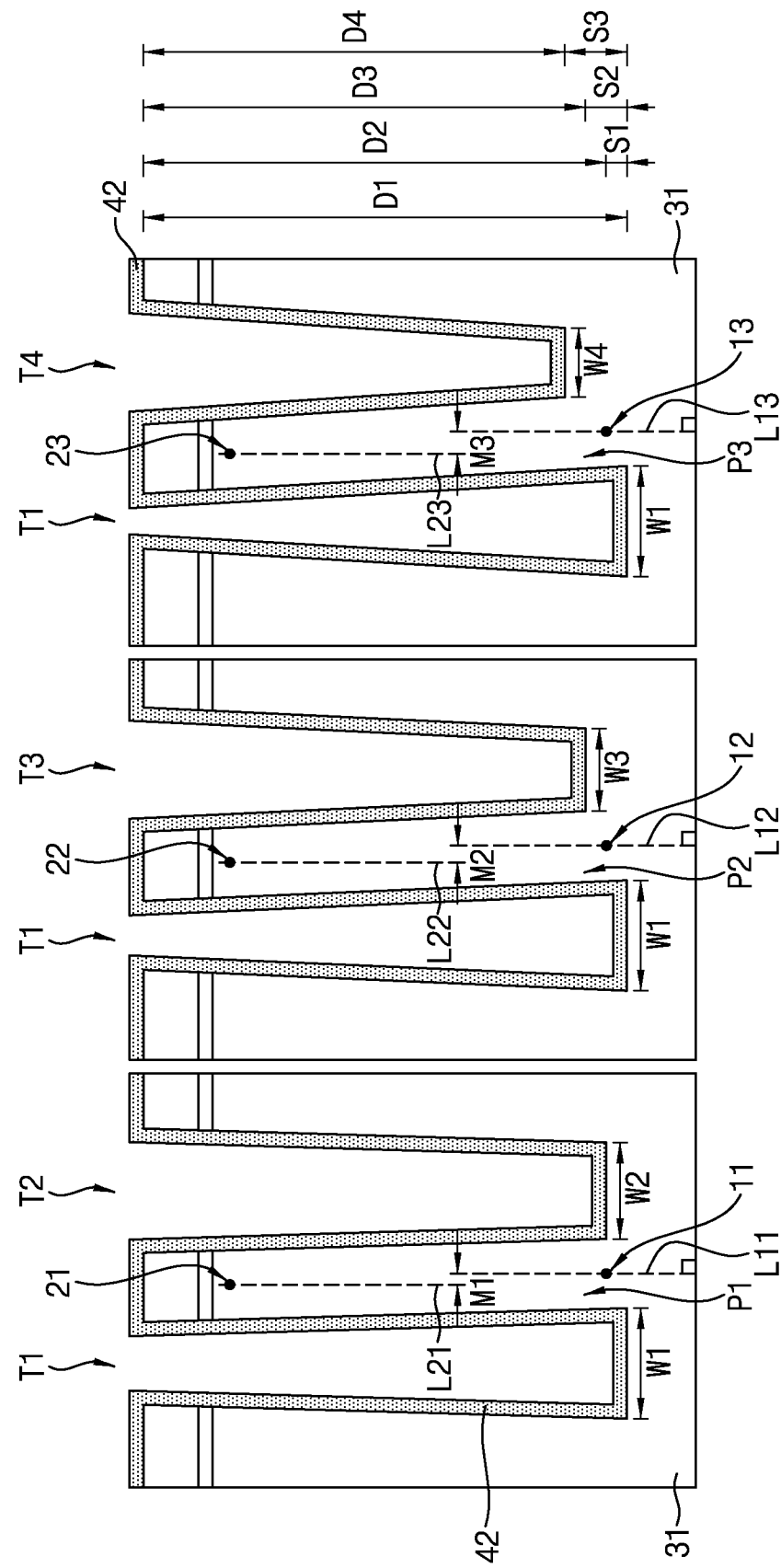

FIGS. 9 to 11 are cross-sectional views illustrating a method of forming a semiconductor device according to embodiments of the disclosure.

Referring to FIG. 9, a plurality of trenches T1, T2, T3, and T4 may be formed to define a plurality of patterns P1, P2, and P3 on a substrate 31. In an embodiment, each of the plurality of patterns P1, P2, and P3 may include an active pattern 35, a buffer layer 37 on the active pattern 35, and a mask layer 39 on the buffer layer 37. The formation of the plurality of patterns P1, P2, and P3 and the plurality of trenches T1, T2, T3, and T4 may include at least one patterning process.

A height of each of the plurality of patterns P1, P2, and P3 may be greater than a lateral width thereof. A height of each of the plurality of trenches T1, T2, T3, and T4 may be greater than a lateral width thereof. The plurality of trenches T1, T2, T3, and T4 may include a plurality of first trenches T1, a second trench T2, a third trench T3, and a fourth trench T4. The plurality of patterns P1, P2, and P3 may include a first pattern P1, a second pattern P2, and a third pattern P3.

Each of the plurality of first trenches T1 may have substantially the same lateral width. Each of the plurality of first trenches T1 may exhibit a first lateral width W1. The second trench T2 may exhibit a second lateral width W2 that is smaller than the first lateral width W1. The third trench T3 may exhibit a third lateral width W3 that is smaller than the second lateral width W2. The fourth trench T4 may exhibit a fourth lateral width W4 that is smaller than the third lateral width W3.

In an embodiment, each of the plurality of first trenches T1 may exhibit a first depth D1. Each of the plurality of first trenches T1 may have substantially the same depth. The second trench T2 may exhibit a second depth D2 that is smaller than the first depth D1. The third trench T3 may exhibit a third depth D3 that is smaller than the second depth D2. The fourth trench T4 may exhibit a fourth depth D4 that is smaller than the third depth D3. A distance between a bottom of the second trench T2 and a lower surface of the substrate 31 may be greater than a distance between a bottom of one of the plurality of first trenches T1 adjacent thereto and the lower surface of the substrate 31. A first step difference S1 may be formed between the second trench T2 and one of the plurality of first trenches T1 adjacent thereto.

A distance between a bottom of the third trench T3 and the lower surface of the substrate 31 may be greater than a distance between a bottom of one of the plurality of first trenches T1 adjacent thereto and the lower surface of the substrate 31. A second step difference S2 may be formed between the third trench T3 and one of the plurality of first trenches T1 adjacent thereto. The second step difference S2 may be greater than the first step difference S1. A distance between a bottom of the fourth trench T4 and the lower surface of the substrate 31 may be greater than a distance between a bottom of one of the plurality of first trenches T1 adjacent thereto and the lower surface of the substrate 31. A third step difference S3 may be formed between the fourth trench T4 and one of the plurality of first trenches T1 adjacent thereto. The third step difference S3 may be greater than the second step difference S2.

In an embodiment, the substrate 31 may include a semiconductor substrate such as a silicon wafer or a silicon-on-insulator (SOI) wafer. The active pattern 35 may be defined adjacent to an upper surface of the substrate 31 due to the plurality of trenches T1, T2, T3, and T4. A height of the active pattern 35 may be greater than a lateral width thereof. The active pattern 35 may exhibit various profiles such as a trapezoidal profile having a lower lateral width greater than an upper lateral width thereof. However, a lower lateral width of the active pattern 35 is assumed to be substantially equal to an upper lateral width thereof for brevity. The buffer layer 37 may include silicon oxide. The mask layer 39 may include a material having an etch selectivity with respect to the active pattern 35. The mask layer 39 may include silicon nitride.

In an embodiment, each of the plurality of trenches T1, T2, T3, and T4 may exhibit various profiles such as a reverse trapezoidal profile having a lower lateral width smaller than an upper lateral width thereof. However, a lower lateral width of each of the plurality of trenches T1, T2, T3, and T4 is assumed to be substantially equal to an upper lateral width thereof for brevity. Each of the plurality of trenches T1, T2, T3, and T4 may have a width which becomes increasingly smaller in a downward direction. A bottom of each of the plurality of trenches T1, T2, T3, and T4 may be rounded.

Referring to FIG. 10, a preliminary liner 41 may be formed to conformally cover sidewalls and bottoms of the plurality of trenches T1, T2, T3, and T4. The preliminary liner 41 may be formed on side surfaces and upper surfaces of the plurality of patterns P1, P2, and P3. The preliminary liner 41 may include silicon, silicon nitride, silicon oxynitride, or a combination thereof.

In an embodiment, the preliminary liner 41 may include polysilicon or amorphous silicon. The preliminary liner 41 may be formed using a thin-film forming apparatus such as a low-pressure chemical vapor deposition (LPCVD) apparatus or an atomic layer deposition (ALD) apparatus. The formation of the preliminary liner 41 may include supplying silane, disilane, amides, or a combination thereof onto the substrate 31 having the plurality of trenches T1, T2, T3, and T4.

Referring to FIG. 11, a leaning control layer 42 may be formed to conformally cover sidewalls and bottoms of the plurality of trenches T1, T2, T3, and T4. The leaning control layer 42 may be formed on side surfaces and upper surfaces of the plurality of patterns P1, P2, and P3. The leaning control layer 42 may include silicon oxide, silicon nitride, silicon oxynitride, or a combination thereof. A thickness of the leaning control layer 42 may be less than 0.5 times a lateral width of a narrowest one of the plurality of trenches T1, T2, T3, and T4. For example, the thickness of the leaning control layer 42 may be about 0.2 times of the fourth lateral width W4.

The leaning control layer 42 may serve to apply compressive stress to the plurality of patterns P1, P2, and P3. Each of the plurality of patterns P1, P2, and P3 may be deformed due to the leaning control layer 42. For example, each of the plurality of patterns P1, P2, and P3 may lean toward a center of one of the plurality of first trenches T1 adjacent thereto.

Due to the leaning control layer 42, the first pattern P1 may lean toward a center of one of the plurality of first trenches T1 adjacent thereto. The first upper straight line L21 may be formed more adjacent to the center of the one of the plurality of first trenches T1 adjacent thereto than the first lower straight line L11. A first length M1 may be formed between the first lower straight line L11 and the first upper straight line L21.

Due to the leaning control layer 42, the second pattern P2 may lean toward a center of one of the plurality of first trenches T1 adjacent thereto. The second upper straight line L22 may be formed more adjacent to the center of the one of the plurality of first trenches T1 adjacent thereto than the second lower straight line L12. A second length M2 may be formed between the second lower straight line L12 and the second upper straight line L22. The second length M2 may be greater than the first length M1.

Due to the leaning control layer 42, the third pattern P3 may lean toward a center of one of the plurality of first trenches T1 adjacent thereto. The third upper straight line L23 may be formed more adjacent to the center of the one of the plurality of first trenches T1 adjacent thereto than the third lower straight line L13. A third length M3 may be formed between the third lower straight line L13 and the third upper straight line L23. The third length M3 may be greater than the second length M2.

The first length M1, the second length M2, and the third length M3 may be controlled using a physical thickness, a material composition, or a forming method of the leaning control layer 42 or a combination thereof.

In an embodiment, the formation of the leaning control layer 42 may include oxidizing the preliminary liner 41 using an oxidation process. The formation of the leaning control layer 42 may include supplying $O_2$, $O_3$, $H_2O_2$, $H_2/O_2$, $O_2$ plasma, or a combination thereof onto the preliminary liner 41. The leaning control layer 42 may include silicon oxide.

Referring again to FIG. 1, a gap-fill insulating layer 45 may be formed on the leaning control layer 42 to fill the plurality of trenches T1, T2, T3, and T4. The formation of the gap-fill insulating layer 45 may be performed using a cyclic deposition process such as an ALD process. In an embodiment, the formation of the gap-fill insulating layer 45 may include a V-shape gap-fill process.

In an embodiment, the formation of the gap-fill insulating layer 45 may include sequentially and repeatedly performing a process of supplying a precursor on the substrate 31 having the leaning control layer 42, a process of supplying a first inert gas on the substrate 31, a process of supplying an oxidant on the substrate 31, a process of supplying a second inert gas on the substrate 31, a process of supplying a surface modifier on the substrate 31, and a processing of supplying a third inert gas on the substrate 31.

A central element of the precursor may include silicon (Si). The precursor may include amides, alkoxides, halides, or a combination thereof. For example, the precursor may include diisopropylamino silane (DIPAS). Each of the first inert gas, the second inert gas, and the third inert gas may include argon (Ar) or helium (He). The oxidant may include $O_2$, $O_3$, $H_2O$, $H_2/O_2$, $O_2$ plasma, or a combination thereof. The surface modifier may include argon (Ar) plasma, oxygen (O₂) plasma, nitrogen (N₂) plasma, helium (He) plasma, or a combination thereof. The gap-fill insulating layer 45 may include silicon oxide.

During the formation of the gap-fill insulating layer 45, each of the plurality of patterns P1, P2, and P3 may be deformed due to a zip-up phenomenon, that is, a phenomenon where an attractive force acts between adjacent layers to bond the adjacent layers to each other. Each of the plurality of patterns P1, P2, and P3 may be deformed depending on the first to fourth depths D1, D2, D3, and D4 of the plurality of trenches T1, T2, T3, and T4. Shapes of the plurality of patterns P1, P2, and P3 may be controlled using the leaning control layer 42 and the gap-fill insulating layer 45. The gap-fill insulating layer 45 may include a seam 45S adjacent to a center of each of the plurality of trenches T1, T2, T3, and T4.

In an embodiment, a deformation force applied by the leaning control layer 42 to the first pattern P1 may be greater than an attractive force applied by the gap-fill insulating layer 45 to the first pattern P1. The first pattern P1 may lean toward a center of one of the plurality of first trenches T1 adjacent thereto. The first upper straight line L21 may be formed more adjacent to one of the plurality of first trenches T1 adjacent thereto than the first lower straight line L11. A first length M1 may be formed between the first lower straight line L11 and the first upper straight line L21.

A deformation force applied by the leaning control layer 42 to the second pattern P2 may be substantially equal to an attractive force applied by the gap-fill insulating layer 45 to the second pattern P2. The second pattern P2 may be formed to be perpendicular onto the substrate 31. The second upper straight line L22 may be arranged to be substantially collinear with the second lower straight line L12. The second length M2 may be substantially zero.

A deformation force applied by the leaning control layer 42 to the third pattern P3 may be smaller than an attractive force applied by the gap-fill insulating layer 45 to the third pattern P3. The third pattern P3 may lean toward a center of the fourth trench T4. The third upper straight line L23 may be formed more adjacent to the center of the fourth trench T4 than the third lower straight line L13. A third length M3 may be formed between the third lower straight line L13 and the third upper straight line L23.

In an embodiment, a central element of the precursor may include silicon (Si), aluminum (Al), titanium (Ti), zirconium (Zr), hafnium (HD, vanadium (V), tantalum (Ta), niobium (Nb), scandium (Sc), yttrium (Y), calcium (Ca), strontium (Sr), barium (Ba), lanthanum (La), cerium (Ce), praseodymium (Pr), samarium (Sm), dysprosium (Dy), or a combination thereof.

Referring to FIG. 7, lower ends of the plurality of trenches T1, T2, T3, and T4 may be rounded. The gap-fill insulating layer 45 and the leaning control layer 42 may be partially removed, and the mask layer 39 and the buffer layer 37 may be removed, thereby exposing an upper region of the active pattern 35.

Upper surfaces of the gap-fill insulating layer 45 and the leaning control layer 42 may remain at a level lower than an upper end of the active pattern 35. The gap-fill insulating layer 45 may include a seam 45S adjacent to a center of each of the plurality of trenches T1, T2, T3, and T4.

A gate dielectric layer 52 may be formed on the active pattern 35. A gate electrode 53 may be formed on the gate dielectric layer 52. The gate dielectric layer 52 may include silicon oxide, silicon nitride, silicon oxynitride, a high-k dielectric, or a combination thereof. The gate electrode 53 may include a conductive layer such as a metal, a metal nitride, a metal oxide, a metal silicide, a conductive carbon, polysilicon, or a combination thereof. The gate dielectric layer 52 may extend between the gate electrode 53 and the gap-fill insulating layer 45. The gate dielectric layer 52 may extend into the seam 45S.

FIGS. 12 to 15 are cross-sectional views illustrating a method of forming a semiconductor device according to embodiments of the disclosure.

Figure 12:
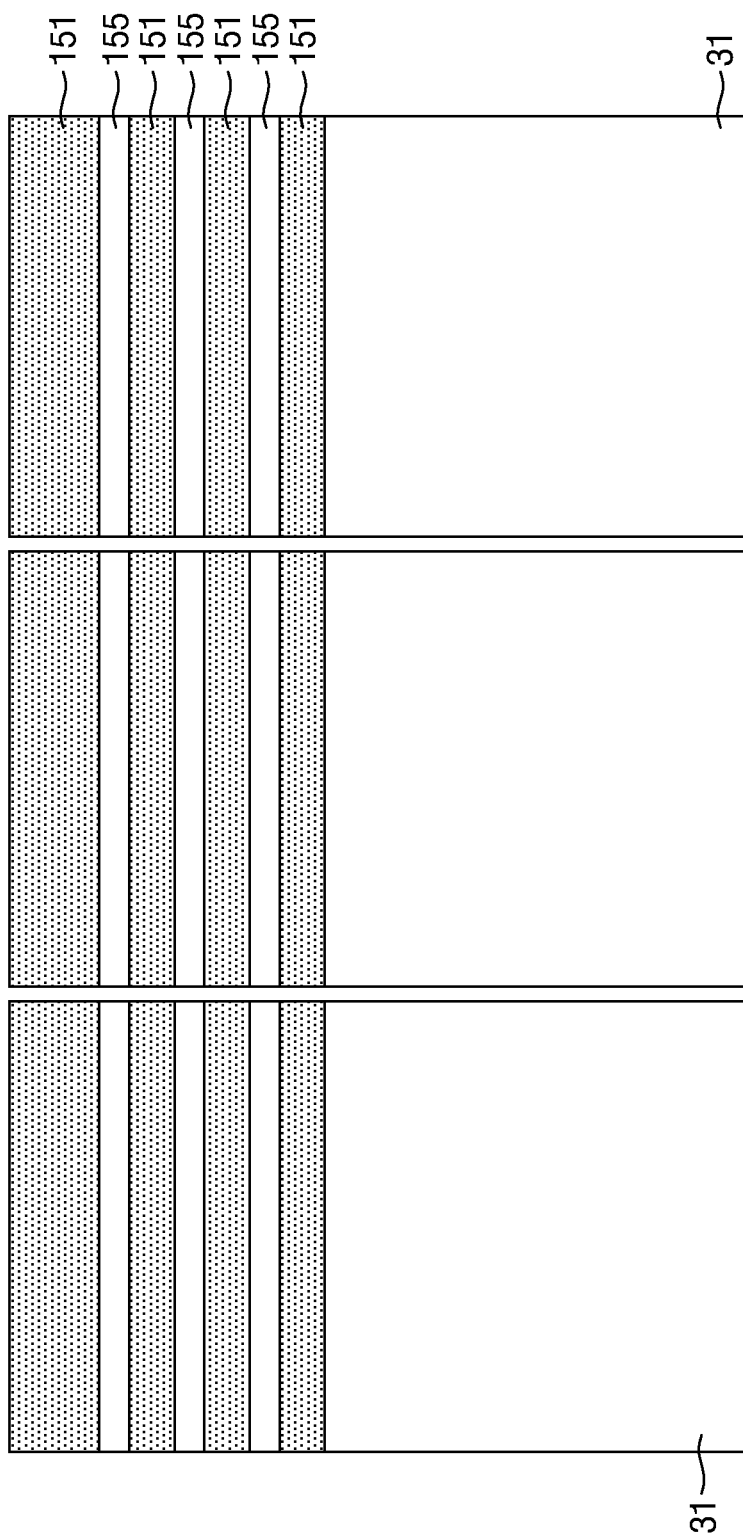

Referring to FIG. 12, a plurality of sacrificial layers 151 and a plurality of channel layers 155 may be alternately and repeatedly stacked on a substrate 31. The plurality of sacrificial layers 151 may include a material having an etch selectivity with respect to the plurality of channel layers 155 and the substrate 31. The plurality of channel layers 155 may include a semiconductor layer such as single crystalline silicon. In an embodiment, the plurality of sacrificial layers 151 may include a silicon germanium (SiGe) layer formed using an epitaxial growth method, and the plurality of channel layers 155 may include a Si layer formed using an epitaxial growth method.

Figure 13:
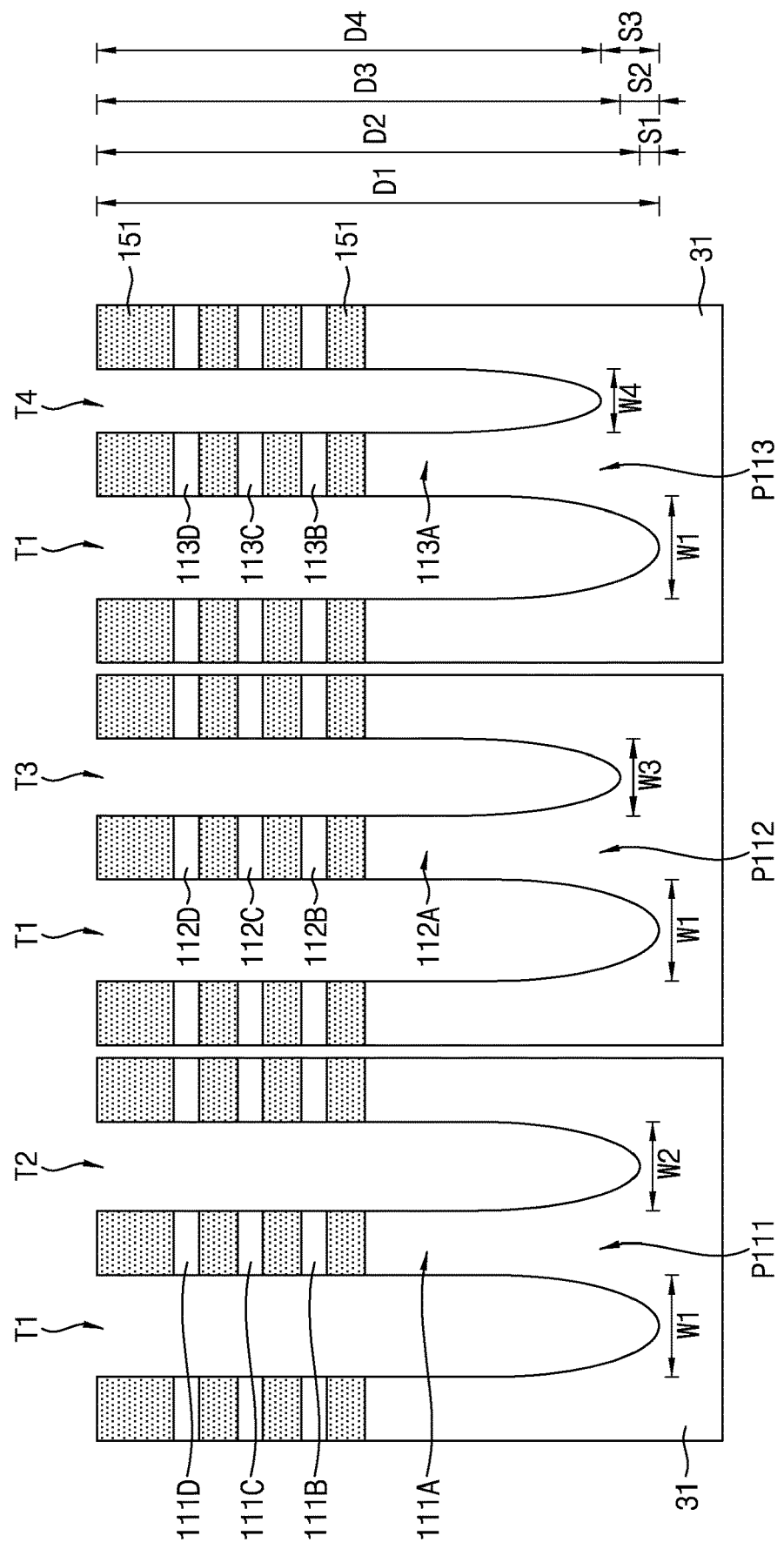

Referring to FIG. 13, a plurality of trenches T1, T2, T3, and T4 may be formed to define a plurality of patterns P111, P112, and P113 on the substrate 31. In an embodiment, the plurality of patterns P111, P112, and P113 may include first to twelfth active patterns 111A to 113D. The plurality of sacrificial layers 151 may remain between the first to twelfth active patterns 111A to 113D. Some of the plurality of sacrificial layers 151 may remain on the fourth active pattern 111D, the eighth active pattern 112D, and the twelfth active pattern 113D. Side surfaces of the plurality of sacrificial layers 151 and side surfaces of the first to twelfth active patterns 111A to 113D may be exposed inside the plurality of trenches T1, T2, T3, and T4.

Figure 14:
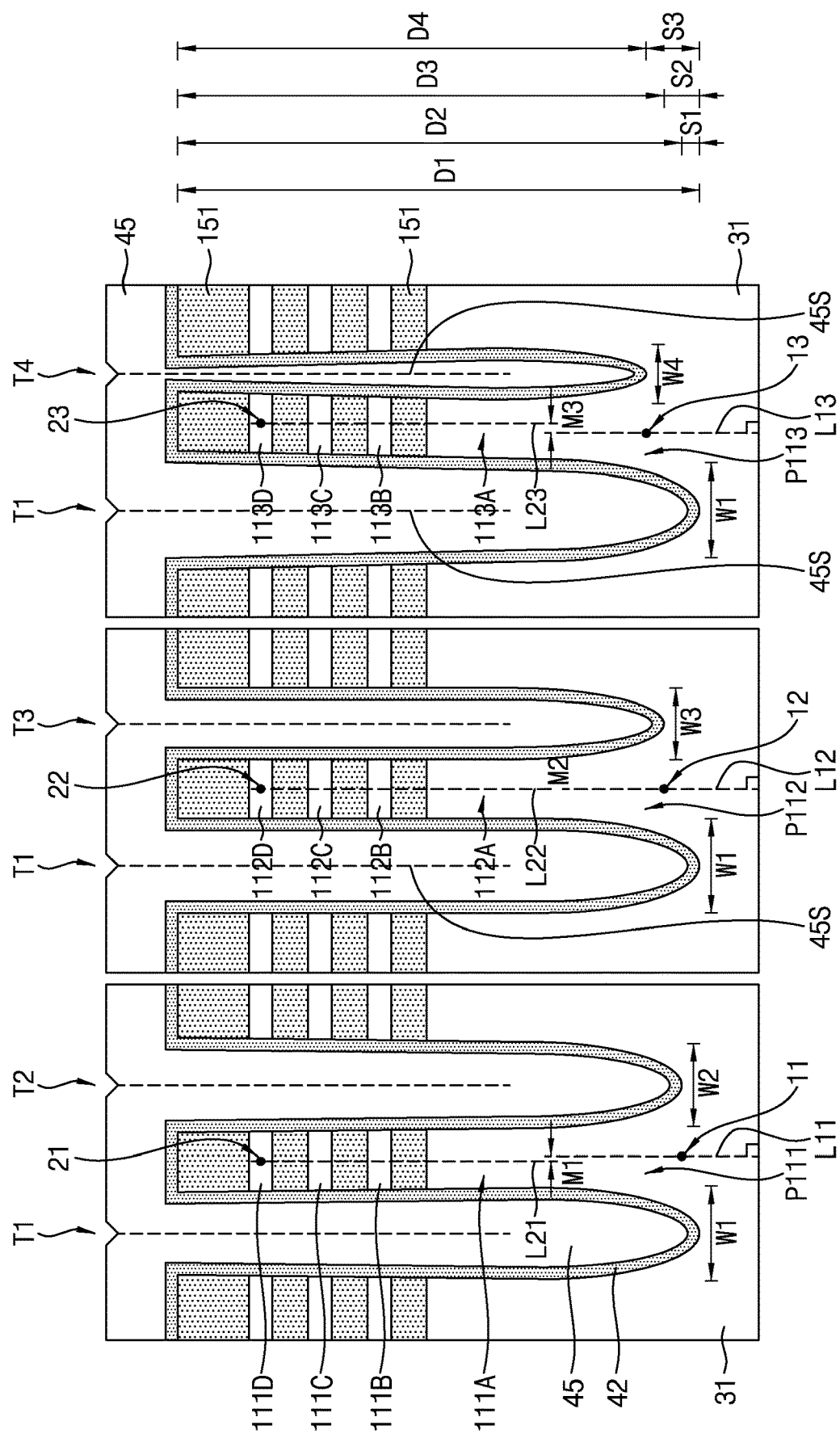

Referring to FIG. 14, a leaning control layer 42 may be formed to conformally cover sidewalls and bottoms of the plurality of trenches T1, T2, T3, and T4. A gap-fill insulating layer 45 may be formed on the leaning control layer 42 to fill the plurality of trenches T1, T2, T3, and T4.

Figure 15:
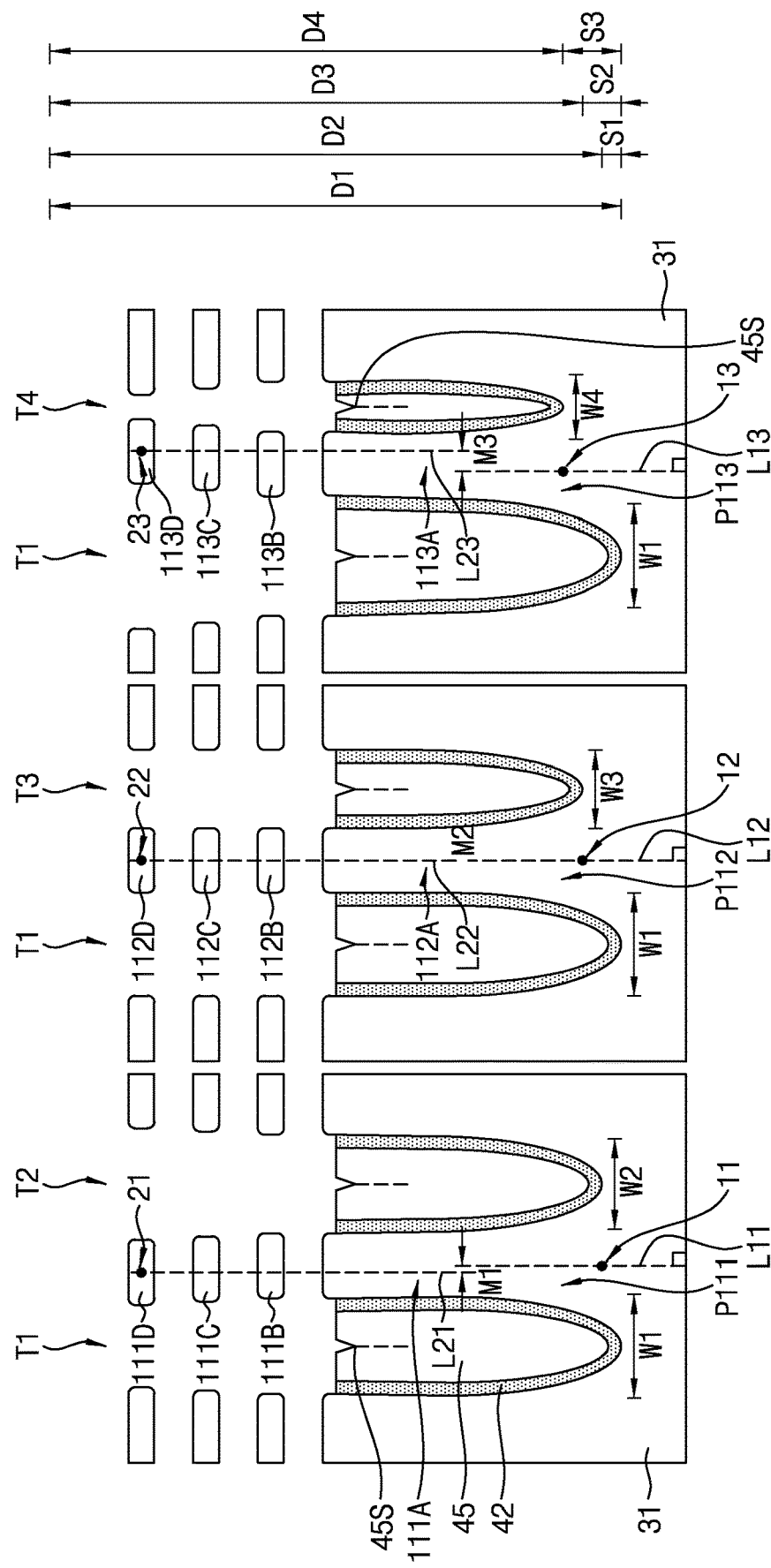

Referring to FIG. 15, the gap-fill insulating layer 45 and the leaning control layer 42 may be partially removed, and the plurality of sacrificial layers 151 may be removed, thereby exposing the first to twelfth active patterns 111A to 113D. Upper surfaces of the gap-fill insulating layer 45 and the leaning control layer 42 may remain at a level lower than upper ends of the first active pattern 111A, the fifth active pattern 112A, and the ninth active pattern 113A. The gap-fill insulating layer 45 may include a seam 45S adjacent to a center of each of the plurality of trenches T1, T2, T3, and T4.

Referring again to FIG. 8, a gate dielectric layer 52 may be formed on the first to twelfth active patterns 111A to 113D. A gate electrode 53 may be formed on the gate dielectric layer 52.

Figure 16:
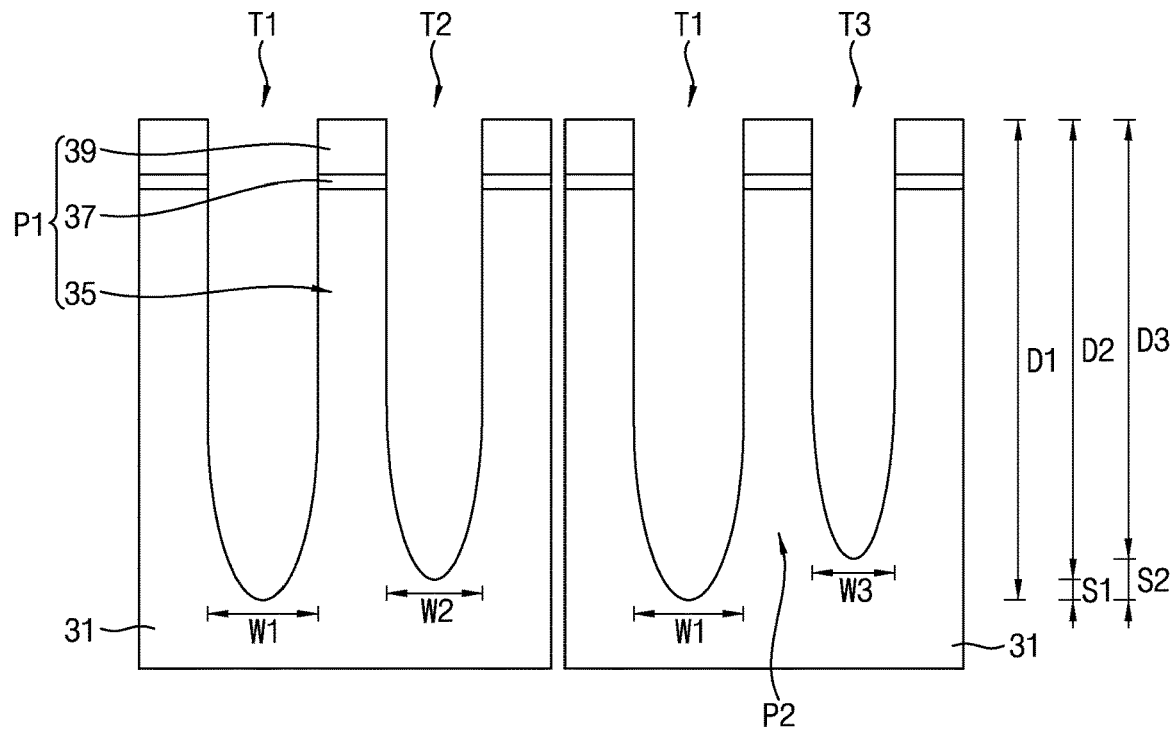
Figure 17:
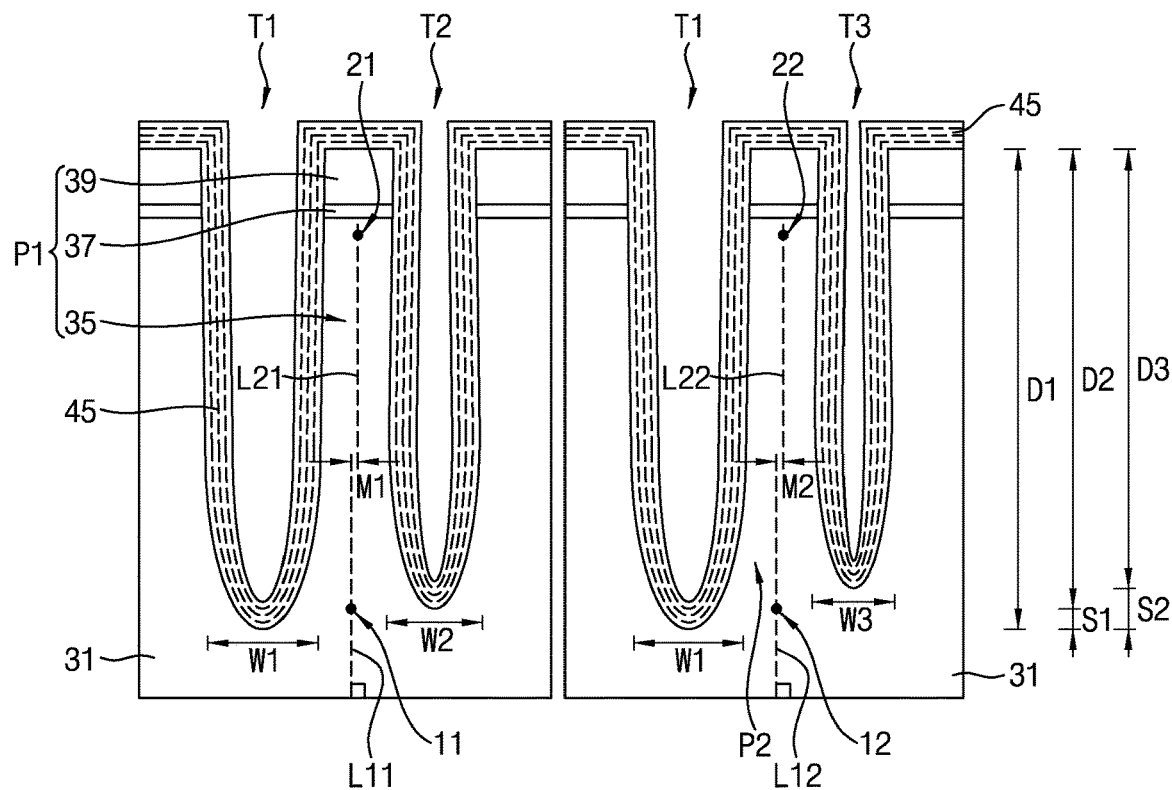
Figure 18:
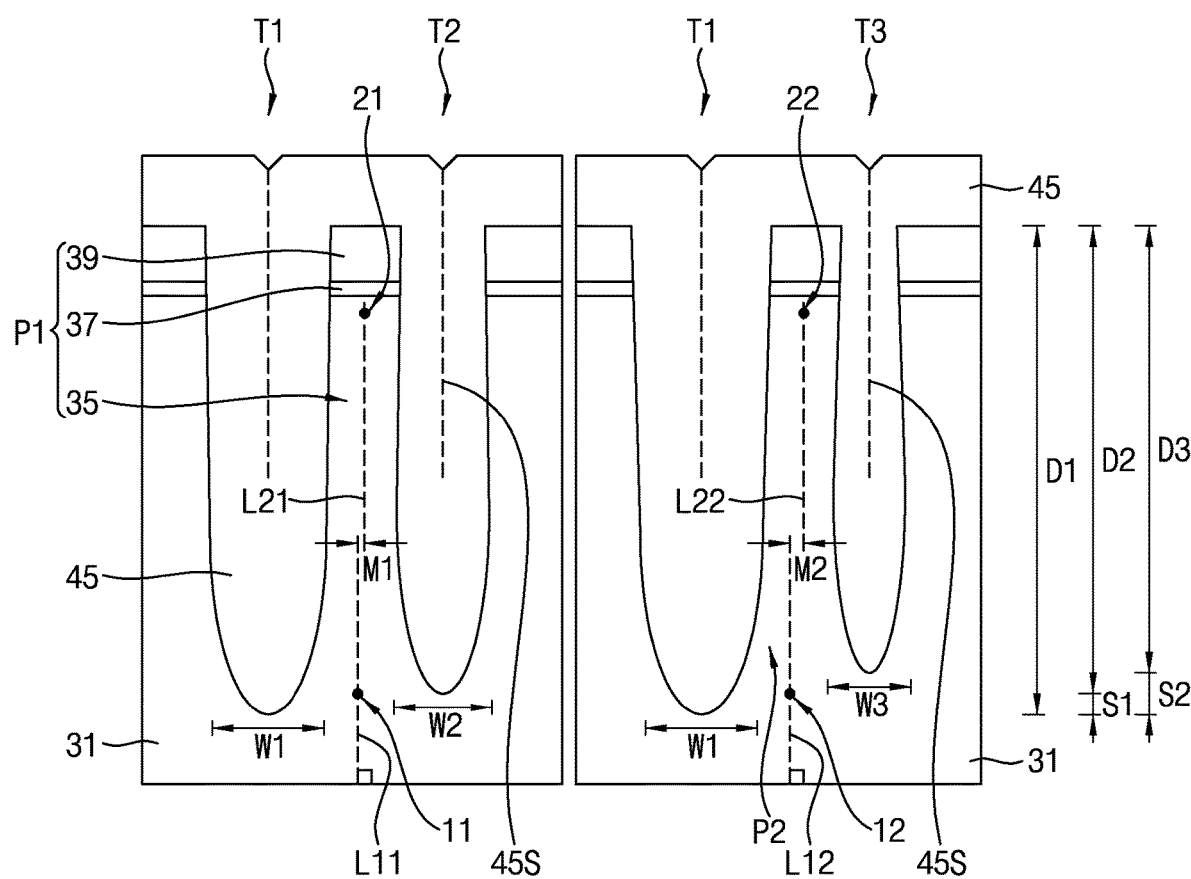

FIGS. 16 to 18 are cross-sectional views illustrating a method of forming a semiconductor device according to an embodiment of the disclosure.

Referring to FIG. 16, a plurality of trenches T1, T2, and T3 may be formed to define a plurality of patterns P1 and P2 on a substrate 31. In an embodiment, each of the plurality of patterns P1 and P2 may include an active pattern 35, a buffer layer 37 on the active pattern 35, and a mask layer 39 on the buffer layer 37.

FIG. 17 is a cross-sectional view illustrating operations of a process of forming a gap-fill insulating layer 45. Referring to FIGS. 17 and 18, a gap-fill insulating layer 45 may be formed to fill the plurality of trenches T1, T2, and T3. The formation of the gap-fill insulating layer 45 may be performed using a cyclic deposition method such as an ALD technique. In an embodiment, the formation of the gap-fill insulating layer 45 may include a V-shape gap-fill process. The gap-fill insulating layer 45 may include a seam 45S adjacent to a center of each of the plurality of trenches T1, T2, and T3.

During the formation of the gap-fill insulating layer 45, each of the plurality of patterns P1, P2, and P3 may be deformed due to a zip-up phenomenon, that is, a phenomenon where an attractive force acts between adjacent layers to bond the adjacent layers to each other. Each of the plurality of patterns P1 and P2 may be deformed depending on first to third depths D1, D2, and D3 of the plurality of trenches T1, T2, and T3.

In an embodiment, the first pattern P1 may lean toward a center of the second trench T2. A first upper straight line L21 may be formed more adjacent to the center of the second trench T2 than a first lower straight line L11. A first length M1 may be formed between the first lower straight line L11 and the first upper straight line L21.

The second pattern P2 may lean toward a center of the third trench T3. A second upper straight line L22 may be formed more adjacent to the center of the third trench T3 than a second lower straight line L12. A second length M2 may be formed between the second lower straight line L12 and the second upper straight line L22. The second length M2 may be greater than the first length M1.

According to the embodiments of the disclosure, a leaning control layer and a gap-fill insulating layer can be provided. The leaning control layer can serve to apply compressive stress to a plurality of patterns. During the formation of the gap-fill insulating layer, each of the plurality of patterns can be deformed due to a zip-up phenomenon, that is, a phenomenon where an attractive force acts between adjacent layers to bond the adjacent layers to each other. Shapes of the plurality of patterns can be controlled using the leaning control layer and the gap-fill insulating layer. A semiconductor device, which is advantageous for a high integration density and has excellent electrical properties, can be implemented.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of forming a semiconductor device, the method comprising:
   forming, on a substrate, a plurality of trenches defining a plurality of patterns, the plurality of trenches including a plurality of first trenches and a second trench adjacent one of the plurality of first trenches, the plurality of patterns including a first pattern between the second trench and the one of the plurality of first trenches, and the second trench having a different depth from the one of the plurality of first trenches adjacent thereto;
   deforming the first pattern by forming a leaning control layer on side walls and bottoms of the plurality of trenches, wherein the first pattern is deformed to lean in a direction away from second trench and toward the one of the plurality of first trenches; and
   forming a gap-fill insulating layer on the leaning control layer,
   wherein the forming the leaning control layer comprises
      forming a preliminary liner on the side walls and the bottoms of the plurality of trenches, and
      oxidizing the preliminary liner using an oxidation process.

2. The method of claim 1, wherein the preliminary liner comprises silicon, silicon nitride, silicon oxynitride, or a combination thereof.

3. The method of claim 1, wherein the forming the gap-fill insulating layer comprises:
   supplying a precursor onto the substrate having the leaning control layer;
   supplying a first inert gas onto the substrate;
   supplying an oxidant onto the substrate;
   supplying a second inert gas onto the substrate;
   supplying a surface modifier onto the substrate; and
   supplying a third inert gas onto the substrate.

4. The method of claim 3, wherein:
   the precursor comprises silicon (Si) as a central element thereof and comprises amides, alkoxides, halides, or a combination thereof; and
   the surface modifier comprises argon (Ar) plasma, oxygen ($O_2$) plasma, nitrogen ($N_2$) plasma, helium (He) plasma, or a combination thereof.

5. The method of claim 1, wherein the leaning control layer comprises a material layer exhibiting compressive stress.

6. The method of claim 1, wherein the leaning control layer comprises silicon oxide, silicon nitride, silicon oxynitride, or a combination thereof.

7. The method of claim 1, wherein:
   the plurality of first trenches having a first depth, and the second trench having a second depth smaller than the first depth; and
   wherein
      a first lower point is defined in the first pattern which is adjacent to a bottom of the second trench while being disposed at a center between the second trench and the one of the plurality of first trenches adjacent thereto,
      a first lower straight line is defined which passes through the first lower point and is perpendicular to a lower surface of the substrate, a first upper point is defined in the first pattern which is disposed in an upper region of the first pattern while being disposed at the center between the second trench and the one of the plurality of first trenches adjacent thereto, and a first upper straight line is defined which passes through the first upper point and is perpendicular to the lower surface of the substrate, the first upper straight line is disposed between the one of the plurality of first trenches and the first lower straight line.

8. The method of claim 7, wherein the second trench has a smaller width than the one of the plurality of first trenches.

9. The method of claim 7, wherein:

the plurality of trenches comprises a third trench having a third depth smaller than the second depth;

the plurality of patterns comprises a second pattern defined between the third trench and one of the plurality of first trenches adjacent thereto; and wherein a second lower point is defined in the second pattern which is adjacent to a bottom of the third trench while being disposed at a center between the third trench and one of the plurality of first trenches adjacent thereto, a second lower straight line is defined which passes through the second lower point and is perpendicular to the lower surface of the substrate, a second upper point is defined in the second pattern which is disposed in an upper region of the second pattern while being disposed at the center between the third trench and the one of the plurality of first trenches adjacent thereto, and a second upper straight line is defined which passes through the second upper point and is perpendicular to the lower surface of the substrate, the second upper straight line is arranged to be substantially collinear with the second lower straight line.

10. The method of claim 9, wherein the third trench has a smaller width than the second trench.

11. The method of claim 9, wherein:

the plurality of trenches comprises a fourth trench having a fourth depth smaller than the third depth;

the plurality of patterns comprises a third pattern defined between the fourth trench and one of the plurality of first trenches adjacent thereto; and wherein a third lower point is defined in the third pattern which is adjacent to a bottom of the fourth trench while being disposed at a center between the fourth trench and the one of the plurality of first trenches adjacent thereto, a third lower straight line is defined which passes through the third upper point and is perpendicular to the lower surface of the substrate, a third upper point is defined in the third pattern which is disposed in an upper region of the third pattern while being disposed at the center between the fourth trench and the one of the plurality of first trenches adjacent thereto, and a third upper straight line is defined which passes through the third upper point and is perpendicular to the lower surface of the substrate, the third upper straight line is disposed between the third lower straight line and the fourth trench.

12. The method of claim 11, wherein the fourth trench has a smaller width than the third trench.

13. The method of claim 1, wherein the gap-fill insulating layer comprises a seam adjacent to a center of each of the plurality of trenches.

14. The method of claim 13, further comprising:

forming a gate electrode on the plurality of patterns; and forming a gate dielectric layer between the gate electrode and the plurality of patterns, wherein the gate dielectric layer extends into the seam.

15. A method of manufacturing a semiconductor device, the method comprising:

forming a first trench having a first depth within a substrate;

forming a second trench having a second depth different from the first depth within the substrate and such that a pattern separates the first trench from the second trench;

deforming the pattern that separates the first trench from the second trench, wherein the pattern is deformed to lean in a direction towards the first trench and away from the second trench, wherein the deforming the pattern comprises, forming a compressive stress layer on an inner surface of each of the first trench and the second trench such that a compressive stress of the compressive stress layer creates a compressive stress force within the compressive stress layer; and forming an insulating layer on the compressive stress layer within each of the first trench and second trench such that a proximity of adjacent portions of the insulating layer creates an attractive force between such adjacent portions of the insulating layer, wherein an extent to which an upper portion of the pattern is deformed to lean toward a longitudinal center of the first trench depends on a depth difference between the first depth of the first trench and the second depth of the second trench and amounts of the attractive force and the compressive stress force.

16. The method of claim 15, wherein the extent to which the upper portion of the pattern is deformed to lean toward the longitudinal center of the first trench depends on a width difference between a width of the first trench and a width of the second trench.

* * * * *